(12) United States Patent
Lee et al.

(10) Patent No.: US 12,414,288 B2
(45) Date of Patent: Sep. 9, 2025

(54) SEMICONDUCTOR DEVICE WITH A VERTICAL CHANNEL WRAPPED AROUND GATE, AND METHOD FOR MANUFACTURING THE SAME

(71) Applicant: TAIWAN SEMICONDUCTOR MANUFACTURING COMPANY, LTD., Hsinchu (TW)

(72) Inventors: Chieh Lee, Hsinchu (TW); Chia-En Huang, Hsinchu (TW); Chun-Ying Lee, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 689 days.

(21) Appl. No.: 17/675,838

(22) Filed: Feb. 18, 2022

(65) Prior Publication Data

US 2023/0269931 A1    Aug. 24, 2023

(51) Int. Cl.
| | |
|---|---|
| H01L 27/108 | (2006.01) |
| H01L 29/417 | (2006.01) |
| H01L 29/66 | (2006.01) |
| H01L 29/786 | (2006.01) |
| H10B 12/00 | (2023.01) |
| H10D 30/01 | (2025.01) |
| H10D 30/67 | (2025.01) |

(52) U.S. Cl.
CPC ....... H10B 12/315 (2023.02); H10B 12/0335 (2023.02); H10B 12/05 (2023.02); H10B 12/482 (2023.02); H10D 30/031 (2025.01); H10D 30/6728 (2025.01); H10D 30/6729 (2025.01)

(58) Field of Classification Search
CPC .................................................. H10B 12/315
See application file for complete search history.

(56) References Cited

U.S. PATENT DOCUMENTS

| | | | | |
|---|---|---|---|---|
| 9,698,272 | B1 * | 7/2017 | Ikeda | H10D 86/481 |
| 2013/0056850 | A1 * | 3/2013 | Kume | H10B 12/315 |
| | | | | 257/532 |
| 2020/0111800 | A1 * | 4/2020 | Ramaswamy | H10B 12/033 |
| 2020/0168636 | A1 * | 5/2020 | Majhi | H01L 29/42312 |
| 2021/0202507 | A1 * | 7/2021 | Thareja | G11C 11/221 |
| 2023/0200075 | A1 * | 6/2023 | Gomes | H10B 43/30 |
| | | | | 257/213 |

* cited by examiner

*Primary Examiner* — Peter Bradford
(74) *Attorney, Agent, or Firm* — Birch, Stewart, Kolasch & Birch, LLP

(57) ABSTRACT

A semiconductor device includes a transistor that is disposed on a substrate. The transistor includes a gate electrode located over the substrate, a gate dielectric disposed on the gate electrode, a channel layer disposed on the gate dielectric, a first source/drain contact disposed on the channel layer and located on a side of the channel layer that is opposite to the substrate, and a second source/drain contact disposed on the channel layer and located on a side of the channel layer that faces the substrate. One of the gate dielectric and the channel layer at least partially surrounds the other one of the gate dielectric and the channel layer. A region of the channel layer between the first source/drain contact and the second source/drain contact is elongated in a direction perpendicular to the substrate.

20 Claims, 29 Drawing Sheets

SEMICONDUCTOR DEVICE WITH A VERTICAL CHANNEL WRAPPED AROUND GATE, AND METHOD FOR MANUFACTURING THE SAME

BACKGROUND

The memory cell of a dynamic random-access memory (DRAM) usually adopts the design of one-transistor, one-capacitor (known as 1T1C) where the transistor may be a planar transistor formed in the front-end-of-line process while the capacitor may be located above the transistor and formed in the back-end-of-line process. The cell size of the DRAM is mostly dependent on the area of the transistor. In order to have lower leakage, the channel of the transistor needs to be long enough which may lead to a larger area of the transistor and therefore a larger cell size of the DRAM.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
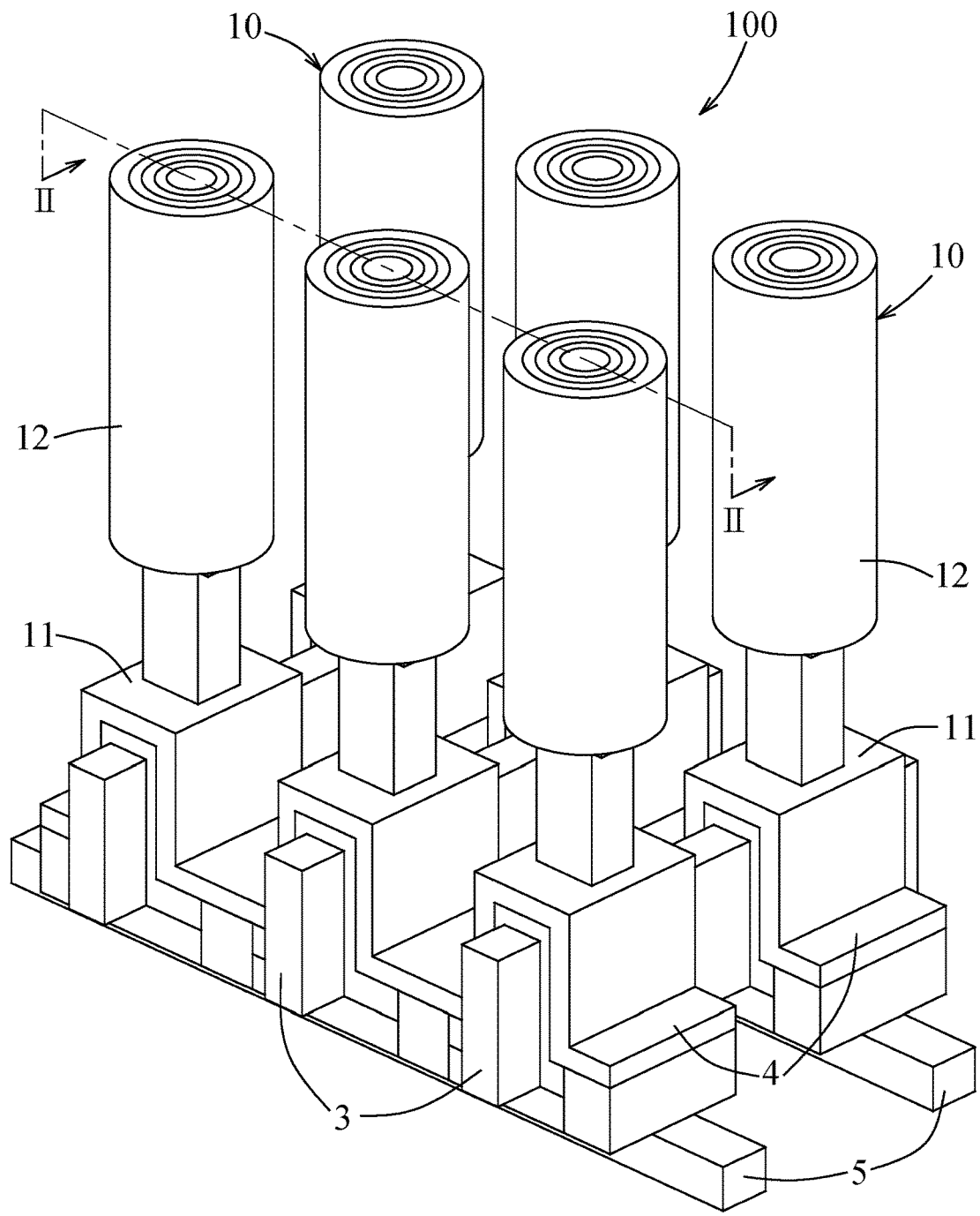
FIG. 1 is a perspective view illustrating a semiconductor device in accordance with some embodiments.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "on," "over," "adjacent," "underneath," "beside," "above," "below," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The disclosure relates to a semiconductor device and a method for manufacturing the same. The semiconductor device includes a memory structure which includes transistors each having vertical channels, so that an area of each of the transistors may be reduced, thereby scaling down a cell area of the memory structure. The memory structure of the semiconductor device further includes capacitors electrically and respectively connected to the transistors so as to implement the design of one-transistor, one-capacitor (known as 1T1C) of the memory structure. The disclosure may be applied in all semiconductor industries.

The transistors included in the memory structure of the semiconductor device may be thin-film transistors (TFTs). A TFT is a type of field-effect-transistor (FET), and may be manufactured by depositing different layers on a substrate. Aside from the memory structure, the TFTs may be used in other kinds of commercial applications such as gate driver circuits, high-frequency display applications, etc. In some cases, a TFT is similar to a metal-oxide-semiconductor field-effect-transistor (MOSFET) in structure, and includes a semiconductor layer, a gate electrode, a source terminal and a drain terminal. The semiconductor layer known as a channel layer is insulated from the gate electrode and is in contact with the source terminal and the drain terminal.

Numerous materials have been proposed to be used for fabricating the TFTs. For example, oxide semiconductors such as indium gallium zinc oxide (IGZO) may be used to form some parts (e.g., the channel layer) of the TFTs. By utilizing such semiconductor material, the fabrication of the TFTs may be integrated in a back end of line (BEOL) portion of a semiconductor fabrication process, instead of a front end of line (FEOL) portion of the semiconductor fabrication process.

Various advantages may be presented by integrating the fabrication of TFTs in the BEOL. For example, the process may be implemented at a relatively lower temperature, and therefore reduces the downside of damaging devices that are already fabricated. It is noted that chip area in the FEOL is considered more valuable than that in the BEOL, and moving the fabrication of TFTs to the BEOL may save valuable chip area in the FEOL for certain devices.

Figure 2:
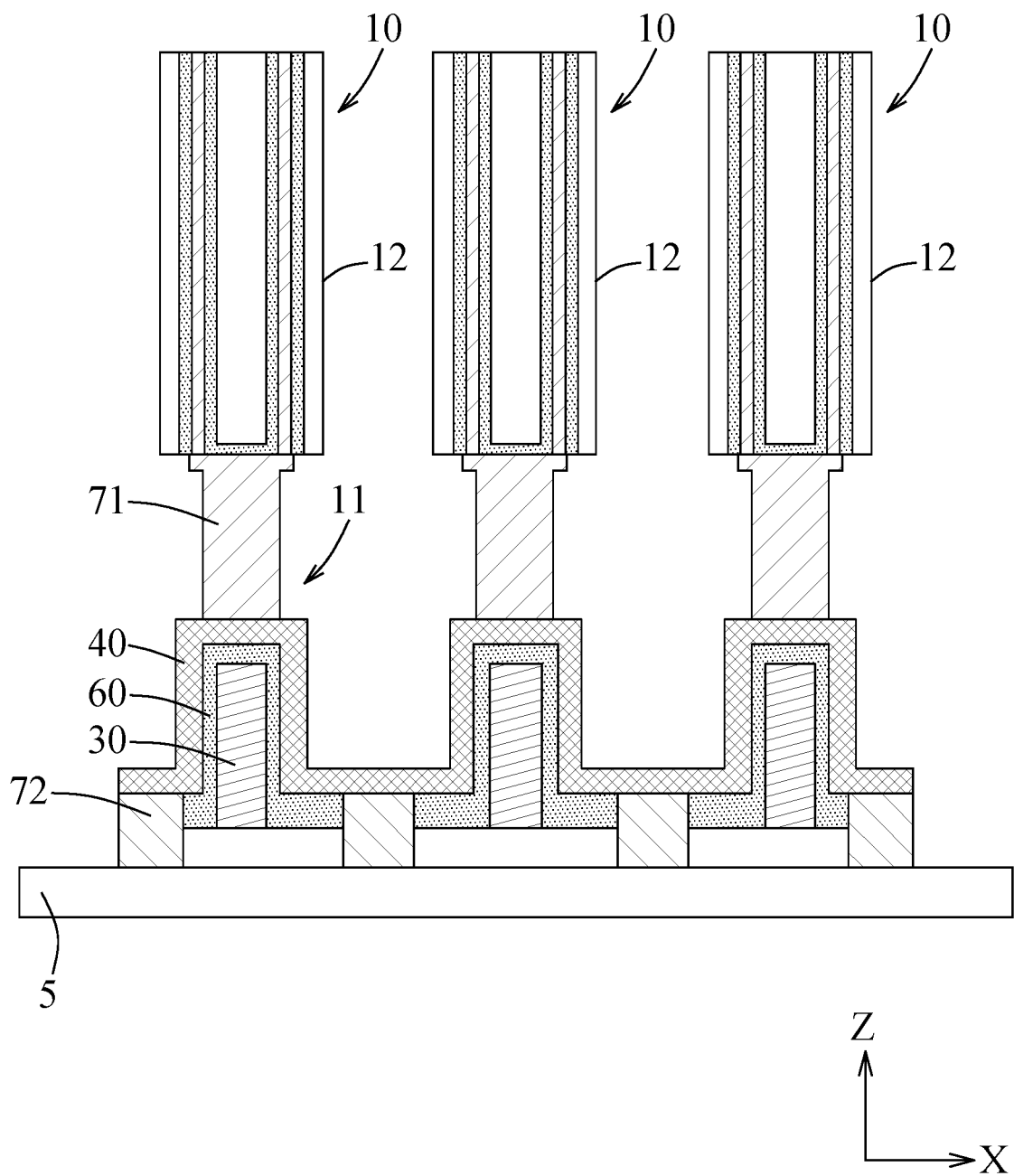
FIG. 2 is a schematic cross-sectional view illustrating the semiconductor device taken along line II-II of FIG. 1.
Figure 3:
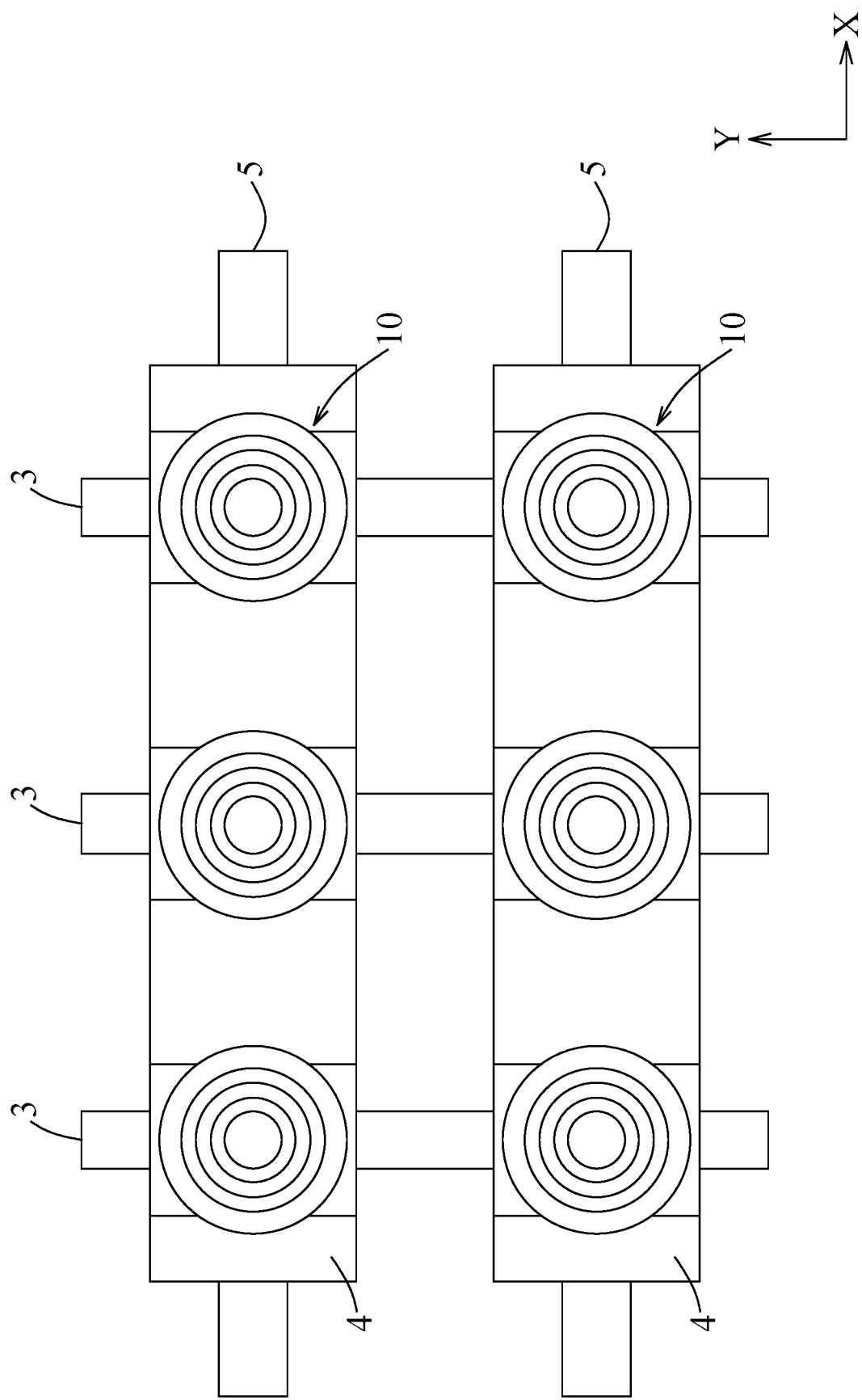
FIG. 3 is a top view illustrating the semiconductor device of FIG. 1, in accordance with some embodiments.

FIG. 1 is a perspective view illustrating a semiconductor device 100 in accordance with some embodiments. FIG. 2 is a schematic cross-sectional view illustrating the semiconductor device 100 taken along line II-II of FIG. 1. FIG. 3 is a top view illustrating the semiconductor device 100 as shown in FIG. 1 in accordance with some embodiments. The semiconductor device 100 includes a three-dimensional (3D) memory structure in a space defined by X-, Y- and Z-axes that are substantially perpendicular to each other. The memory structure includes at least one memory cell. Six memory cells 10 are exemplarily depicted in FIG. 1, but the number of the memory cells is not limited to the disclosure herein. Each of the memory cells includes a transistor 11 and a capacitor 12 electrically connected to the transistor 11, and is thus a 1T1C memory cell. In some embodiments, the semiconductor device 100 may be fabricated in the BEOL, while in certain embodiments, the semiconductor device 100 may be fabricated in the FEOL. In some embodiments, the memory structure of the semiconductor device 100 may be, for example, DRAM. However, other suitable memory devices are within the contemplated scope of the disclosure.

In some embodiments, the semiconductor device 100 may be formed in an interlayer dielectric (ILD) layer of the BEOL. The ILD layer may include a dielectric material such as, but not limited to, oxide, silicon oxide, a low-k material, or combinations thereof. For example, the ILD layer may include, but not limited to, silica ($SiO_2$), hafnium silicate ($HfSiO_4$), zirconium silicate ($ZrSiO_4$), or combinations thereof. In alternative embodiments, the ILD layer may include, but not limited to, polyimide, epoxy resin, acrylic resin, phenol resin, benzocyclobutene (BCB), polybenzoxazole (PBO), other suitable polymer-based dielectric materials, or combinations thereof. Other suitable dielectric materials are within the contemplated scope of the present disclosure.

In some embodiments, the semiconductor device 100 may include at least one gate feature which extends in the direction of the Y-axis, at least one channel feature which extends in the direction of the X-axis and transverse to the gate feature and which is located over the gate feature, at least one capacitor which extends in the direction of the Z-axis and which is electrically connected to the channel feature at a location where the channel feature crosses over the gate feature, and at least one bit line which extends in the direction of the X-axis and which is located under the gate feature. Referring to FIG. 1, the semiconductor device 100 exemplarily includes three gate features 3, two channel features 4 each crossing over the three gate features 3, six capacitors 12 respectively located over locations where the two channel features 4 cross over the three gate features 3 (i.e., where the transistors 11 of the memory cells 10 may be formed), and two bit lines 5 located under the three gate features 3 and the two channel features 4 and corresponding in position to the two channel features 4 in the direction of the Z-axis. However, the numbers of the gate features 3, the channel features 4, the capacitors 12 and the bit lines 5 of the semiconductor device 100 are not limited to the example shown in FIG. 1. The gate features 3 are elongated in the direction of the Y-axis, and may serve as word lines of the memory structure. Since the capacitors 12 are stacked over the transistors 11, the memory cells 10 of the semiconductor device 100 are stacked-capacitor cells. Alternatively, a trench-capacitor design may be utilized to fabricate the memory cells of the semiconductor device in accordance with some embodiments.

Referring to FIG. 2, three of the six memory cells 10 of FIG. 1 are exemplarily illustrated from the perspective of the schematic cross-sectional view of FIG. 2. For each of the memory cells 10, the transistor 11 includes a gate electrode 30, a gate dielectric 60 which is formed on the gate electrode 30 and which partially surrounds the gate electrode 30, a channel layer 40 which is formed on the gate dielectric 60 and which partially surrounds the gate dielectric 60, and two source/drain contacts. A first source/drain contact of the two source/drain contacts (referred to as a connector contact 71 hereinafter) is formed on the channel layer 40 and is connected to the capacitor, and a second source/drain contact of the two source/drain contacts (referred to as a via contact 72 hereinafter) is formed on the channel layer 40 and is connected to the bit line 5 underneath the channel layer 40. The gate dielectric 60 is formed on sidewalls and a top surface of the gate electrode 30 to partially surround the gate electrode 30. The channel layer 40 is formed on sidewalls and a top surface of the gate dielectric 60 to partially surround the gate dielectric 60. The connector contact 71 is formed on a top portion of the channel layer 40 that is formed over the top surfaces of the gate dielectric 60 and the gate electrode 30. The via contact 72 is formed on the bit line 5 and is in contact with a bottom portion of the channel layer 40 that is adjacent to a foot of the sidewall of the gate electrode 30. A region of the channel layer 40 between the connector contact 71 and the via contact 72 may serve as a channel of the transistor 11, and the channel is elongated in the direction of the Z-axis. A sidewall of the region of the channel layer 40 between the connector contact 71 and the via contact 72 may have a dimension (e.g., a height in the direction of the Z-axis) greater than a dimension of a top surface of the channel layer 40 (e.g., a width in the direction of the X-axis). In some embodiments, since the channel may be oriented in a direction perpendicular to a substrate on which the transistor 11 is disposed, the memory structure may be referred to as vertical-channel transistor memory. It is noted that as shown in FIGS. 1 and 2, a segment of the channel feature 4 that crosses over and partially surrounds the gate feature 3 may serve as the channel layer 40 of the corresponding transistor 11, and a segment of the gate feature 3 that is partially surrounded by the channel layer 40 may serve as the gate electrode 30 of the corresponding transistor 11. In some embodiments, the connector contacts may be source contacts of the transistors and the via contacts may be drain contacts of the transistors. Alternatively, in other embodiments, the connector contacts may be drain contacts of the transistors while the via contacts may be source contacts of the transistors.

For each of the transistors, the gate electrode may include a metallic material, polycrystalline silicon, doped silicon, or a metal compound, such as metal nitride. The metallic material may include, for example, but not limited to, tungsten (W), silver (Ag), aluminum (Al), copper, nickel (Ni), other suitable materials, alloys thereof, or combinations thereof. The metal compound may include, for example, but not limited to, titanium nitride (TiN), tantalum nitride (TaN), metal silicide, other suitable materials, or combinations thereof. Other suitable materials for fabricating the gate electrode are within the contemplated scope of the present disclosure.

For each of the transistors, the gate dielectric may include a high dielectric constant material such as, but not limited to, silicon oxide ($SiO_2$), silicon nitride ($Si_3N_4$), silicon oxynitride ($SiO_xN_y$), hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), zirconium silicate, zirconium aluminate, zirconium oxide, titanium oxide, aluminum oxide ($Al_2O_3$), hafnium dioxide-alumina ($HfO_2$—$Al_2O_3$) alloy, or combinations thereof. Other suitable gate dielectric materials are within the contemplated scope of the present disclosure.

For each of the transistors, the channel layer may be an N-type channel and include an oxide semiconductor material such as, but not limited to, indium gallium zinc oxide (IGZO), zinc oxide (ZnO), indium oxide ($In_2O_3$), tin dioxide ($SnO_2$), indium zinc oxide (IZO), indium tin oxide (InSnO), and the like; alternatively, the channel layer may be a P-type channel and include an oxide semiconductor material such as, but not limited to, nickel oxide (NiO), cuprous oxide ($Cu_2O$), copper aluminum oxide ($CuAlO_2$), copper gallium oxide ($CuGaO_2$), copper indium oxide ($CuInO_2$), strontium copper oxide ($SrCu_2O_2$), stannous oxide (SnO), and the like. In some embodiments, the channel layer may further include, for example, but not limited to, amorphous silicon, crystalline silicon, low-temperature polycrystalline silicon (LTPS), tungsten-doped indium oxide (IWO), gallium oxide ($GaO_x$), or the like. Other suitable channel materials are within the contemplated scope of the present disclosure.

The source/drain contacts are typically fabricated using metals such as tungsten (W), ruthenium (Ru), copper (Cu), aluminum (Al), or cobalt (Co), metal nitride, such as titanium nitride (TiN) or tantalum nitride (TaN), polycrystalline silicon, or combinations thereof. Other suitable metal materials for fabricating the source/drain contacts are within the contemplated scope of the present disclosure.

Referring to FIG. 3, each of the gate features 3 has a width of a feature size F, a spacing between any adjacent two of the gate features 3 has substantially the same feature size F, each of the bit lines 5 has a width of substantially the same feature size F, and a spacing between any adjacent two of the bit lines 5 has substantially the same feature size F. In this way, a minimum distance from the gate electrode of one transistor to the gate electrode of another transistor (i.e., a gate pitch) is equal to 2 F, and a distance between centers of neighboring bit lines (i.e., a bit line pitch) is also equal to 2 F. As a result, the area of each of the memory cells 10 of the memory structure is equal to 4 $F^2$. By making the channels of the transistors vertical, each of the transistors may have a smaller area, and a cell size of the memory structure may be reduced.

Figure 4:
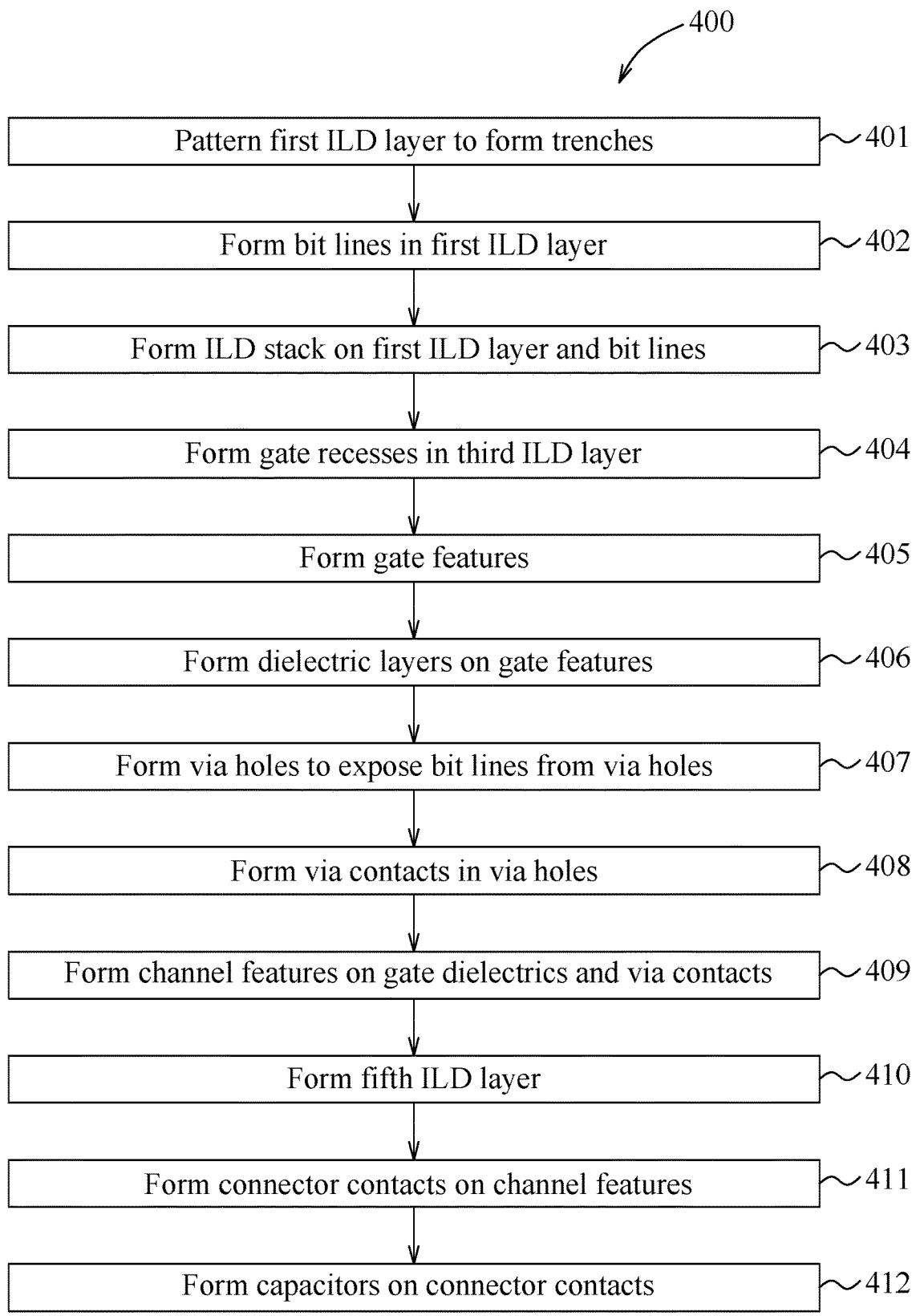
FIG. 4 is a flow diagram illustrating a method for manufacturing a semiconductor device in accordance with some embodiments.

FIG. 4 is a flow diagram illustrating a method 400 for manufacturing a semiconductor device, such as the semiconductor device 100 shown in FIG. 1, in accordance with some embodiments. FIGS. 5 to 18 illustrate schematic cross-sectional views of the semiconductor device 100 from the same perspective as FIG. 2 during various intermediate stages of the method 400. From such perspective, among the bit lines 5 and the channel features 4 of the semiconductor device 100 shown in FIG. 1, only one bit line 5 and one channel feature 4 are visible in FIGS. 5 to 18. It is noted that implementation of the method 400 is not limited to the conditions or structures of the semiconductor device 100 shown in FIGS. 5 to 18, and may be applicable to other conditions or structures of a suitable semiconductor device.

Referring to FIG. 4, the method 400 begins at step 401, where a first ILD layer is patterned to form trenches.

Figure 5:
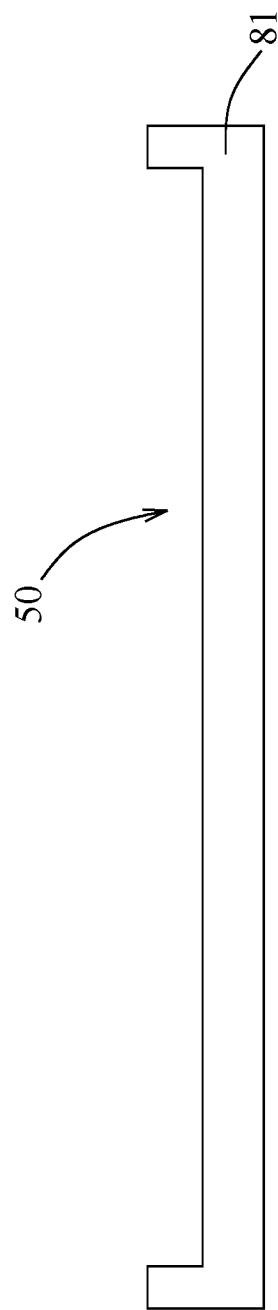
FIGS. 5 to 18 are schematic cross-sectional views illustrating intermediate stages of the method as depicted in FIG. 4, in accordance with some embodiments.
Figure 6:
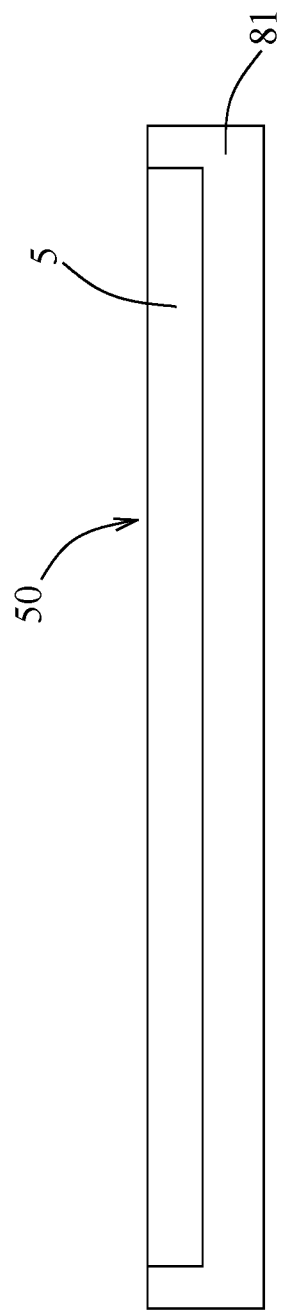
Figure 7:
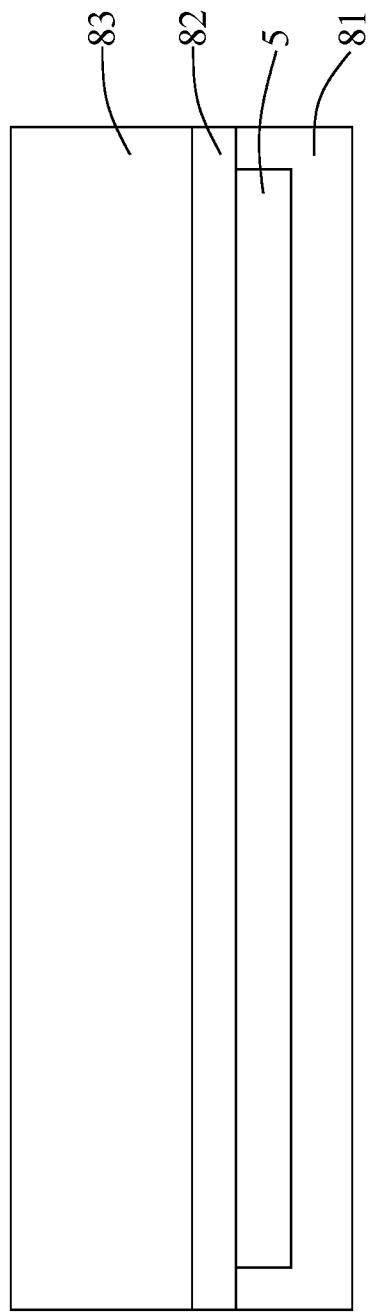
Figure 8:
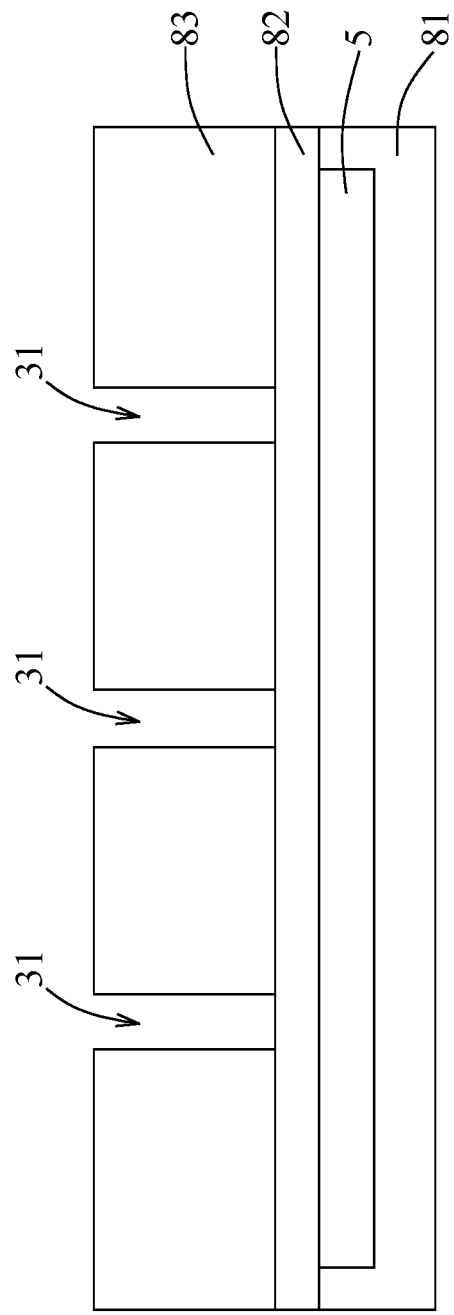

Referring to the example illustrated in FIG. 5, a first ILD layer 81 is patterned by using a photolithography process and an etching process so as to form a trench 50 in the first ILD layer 81. In some embodiments, the first ILD layer may be a single material layer. In alternative embodiments, the first ILD layer may include multiple films made of different materials. The first ILD layer may be formed by using, for example, but not limited to, chemical vapor deposition (CVD), physical vapor deposition (PVD), sputtering, combinations thereof, or other suitable techniques. In some embodiments, the material for making the first ILD layer is similar to those for making the ILD layer of the BEOL described above, and the details thereof are omitted herein for the sake of brevity.

The photolithography process may include, for example, but not limited to, coating a photoresist, soft-baking, exposing the photoresist through a photomask, post-exposure baking, and developing the photoresist, followed by hard-baking, so as to form a patterned photoresist. The etching process for patterning the first ILD layer may be implemented by etching the first ILD layer through the patterned photoresist using, for example, but not limited to, a dry etching process, a wet etching process, other suitable processes, or combinations thereof. In some embodiments, step 401 may be implemented in BEOL of the fabrication process.

Referring to FIG. 4, the method 400 then proceeds to step 402, where bit lines are formed in the first ILD layer. Referring to the example illustrated in FIG. 6, a bit line 5 is formed in the trench 50 of the first ILD layer 81 by depositing a conductive material to fill the trench 50 and then removing excess of the conductive material above the first ILD layer 81 by a planarization technique, such as chemical mechanical planarization (CMP). In some embodiments, the conductive material may include metallic material, for example, but not limited to, ruthenium (Ru), cobalt (Co), molybdenum (Mo), tungsten (W), nickel (Ni), iridium (Ir), rhodium (Rh), osmium (Os), or the like, metal nitride, for example, but not limited to, titanium nitride (TiN), tantalum nitride (TaN), or the like, or combinations thereof. In some embodiments, deposition of the metal material may be conducted by a suitable fabrication technique known to those skilled in the art of semiconductor fabrication, for example, but not limited to, CVD, plasma-enhanced CVD (PECVD), atomic layer deposition (ALD), plasma-enhanced ALD (PEALD), or other suitable deposition techniques.

Referring to FIG. 4, the method 400 then proceeds to step 403, where an ILD stack is formed on the first ILD layer and the bit lines. Referring to the example illustrated in FIG. 7, a second ILD layer 82 is formed on the first ILD layer 81 and the bit line 5, an etch stop layer (not shown) is then formed on the second ILD layer 82, and a third ILD layer 83 is later formed on the etch stop layer. The second ILD layer, the etch stop layer and the third ILD layer constitute the ILD stack. The materials and processes used for forming the second ILD layer and the third ILD layer are similar to those for forming the first ILD layer, and the details thereof are omitted herein for the sake of brevity. It is noted that each of the second ILD layer and the third ILD layer may include a material that is different from that of the first ILD layer, or a material that is exactly the same as that of the first ILD layer. Similarly, the second ILD layer may include a material that is different from that of the third ILD layer, or a material that is exactly the same as that of the third ILD layer. The etch stop layer is formed on the second ILD layer by a suitable fabrication technique known to those skilled in the art of semiconductor fabrication, for example, but not limited to, CVD, ALD, PVD, PECVD, or the like. In some embodiments, the etch stop layer may be made of a dielectric material, for example, but not limited to, silicon nitride, silicon nitride doped with carbon, silicon oxide, silicon oxynitride, silicon oxynitride doped with carbon, amorphous carbon material, silicon carbide, other nitride materials, other carbide materials, aluminum oxide, other oxide materials, other metal oxides, boron nitride, boron carbide, other low-k dielectric materials, other low-k dielectric materials doped with one or more of carbon, nitrogen and hydrogen, or other suitable materials.

Referring to FIG. 4, the method 400 then proceeds to step 404, where a plurality of gate recesses are formed in the third ILD layer. Referring to the example illustrated in FIG. 8, the third ILD layer 83 is recessed by an anisotropic etching process, through a patterned photoresist, to form a plurality of gate recesses 31 in the third ILD layer 83. The anisotropic etching process may be a suitable anisotropic etching process, for example, but not limited to, anisotropic dry etching. Because of the existence of the etch stop layer, etching of the third ILD layer would stop at the etch stop layer, and the recesses would not be formed in the second ILD layer.

Figure 9:
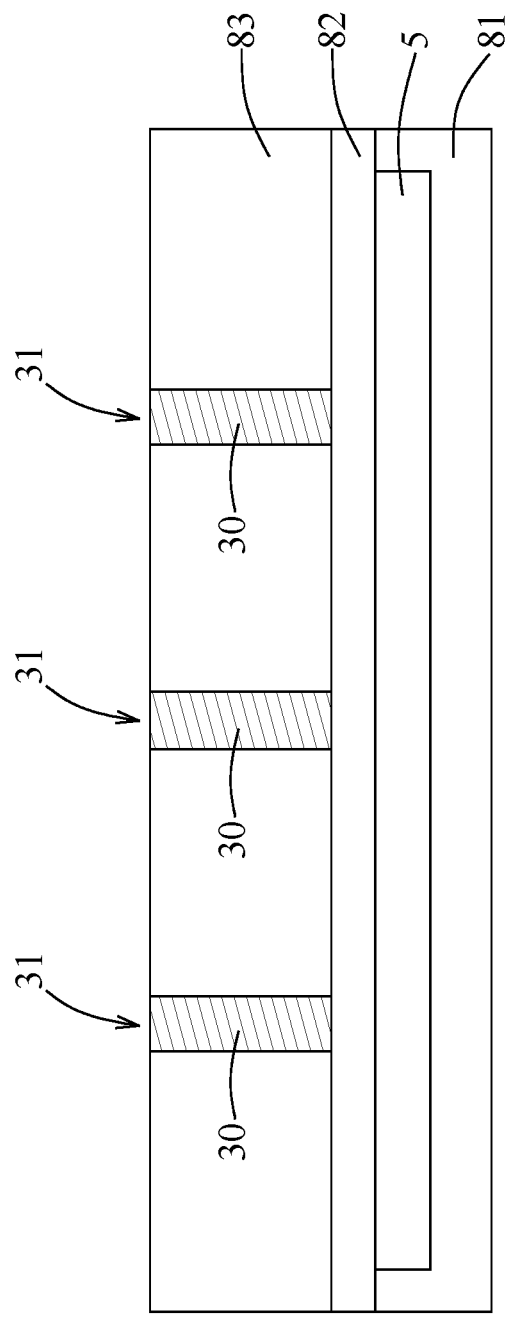
Figure 10:
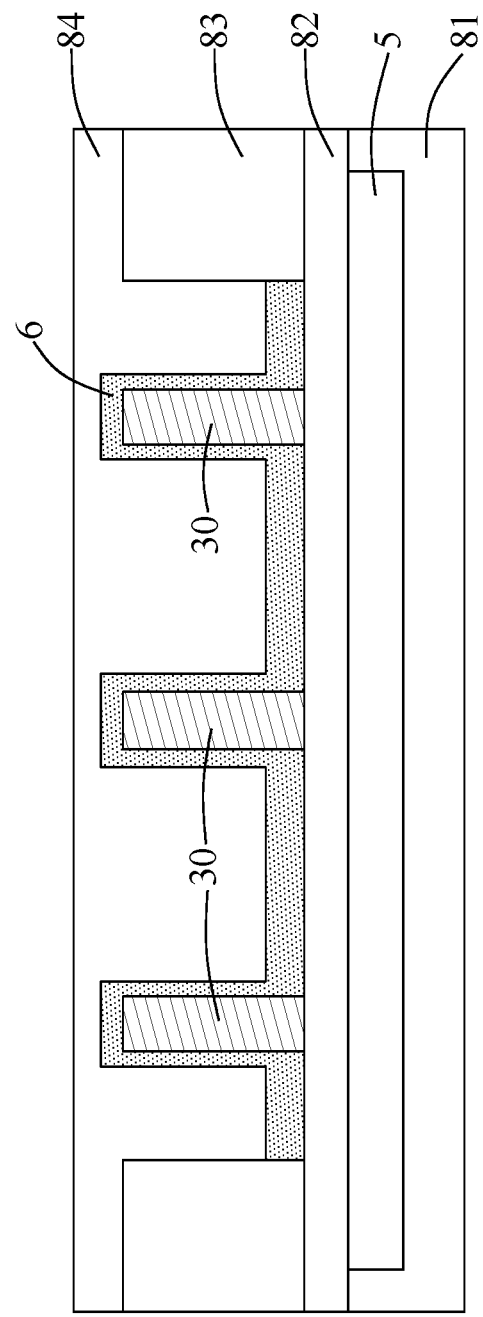
Figure 11:
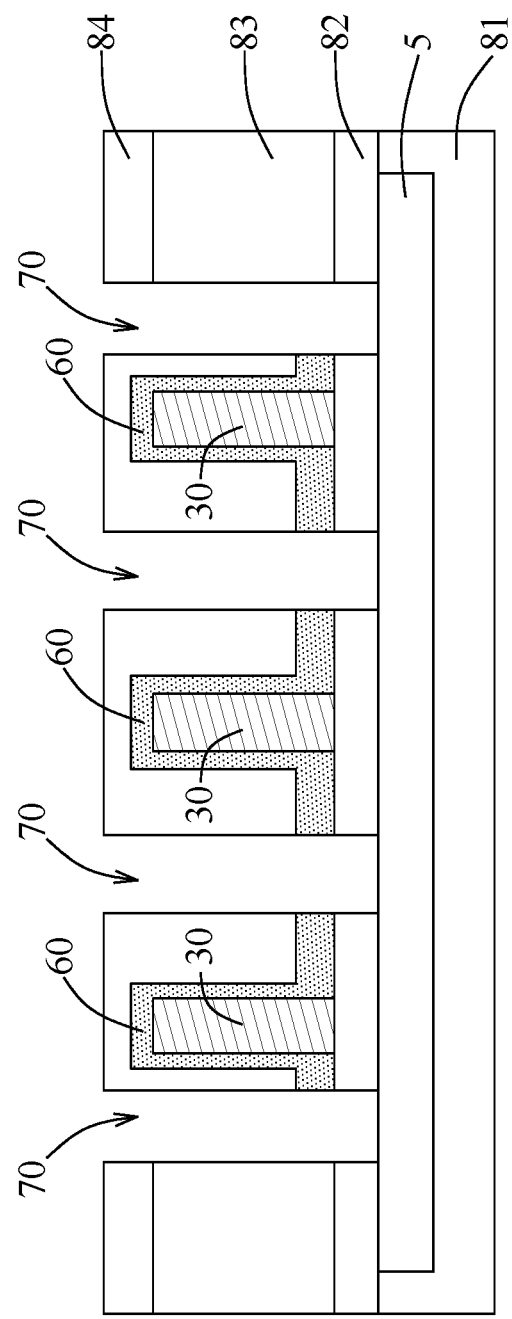
Figure 12:
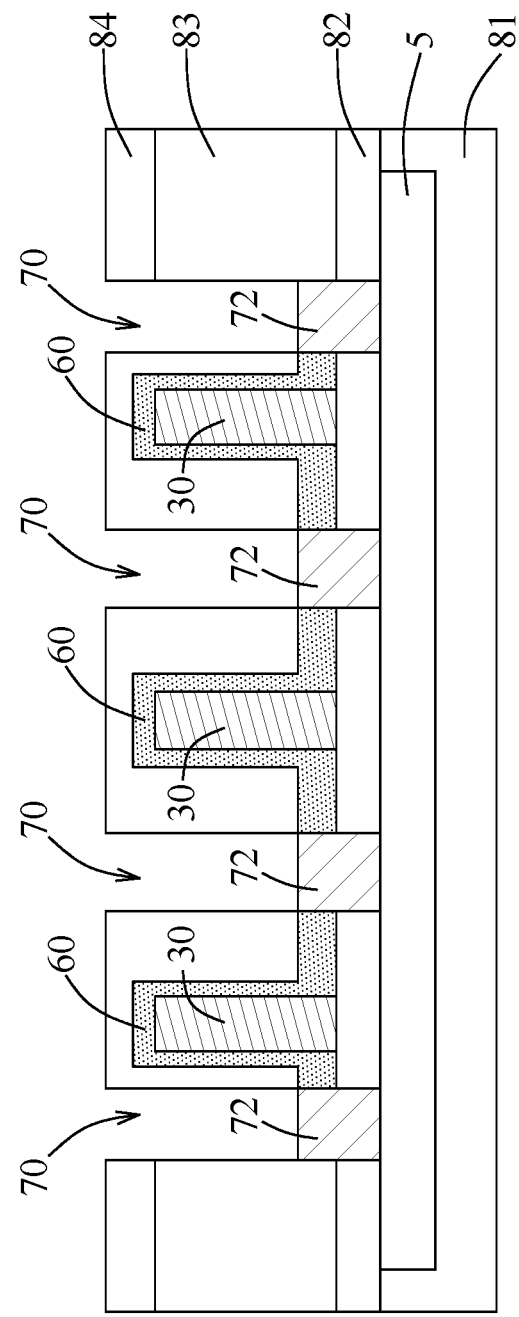
Figure 13:
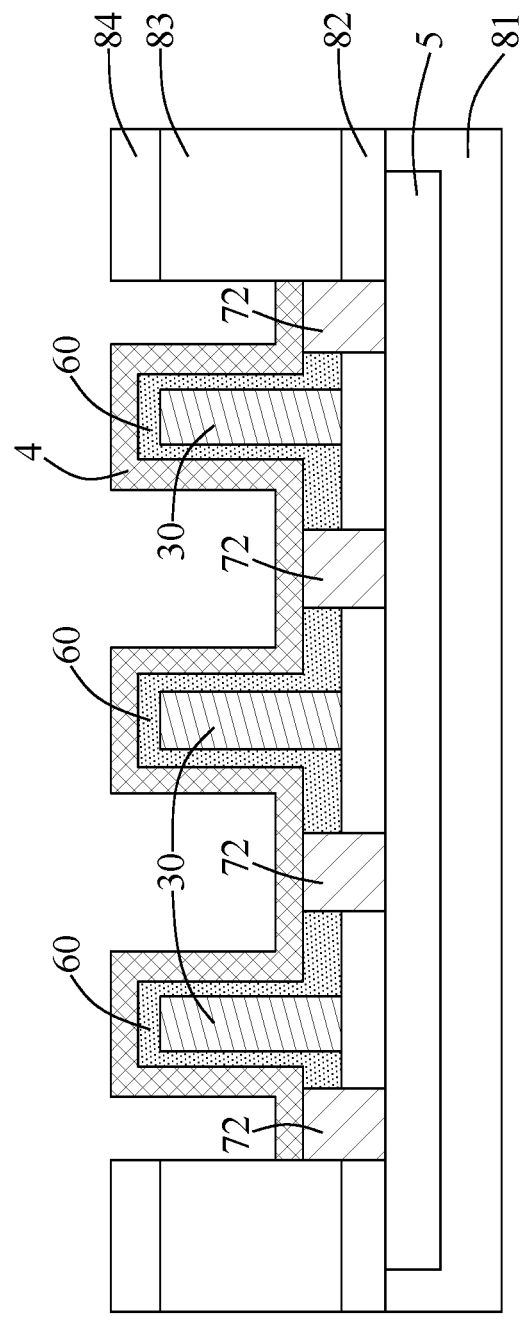
Figure 14:
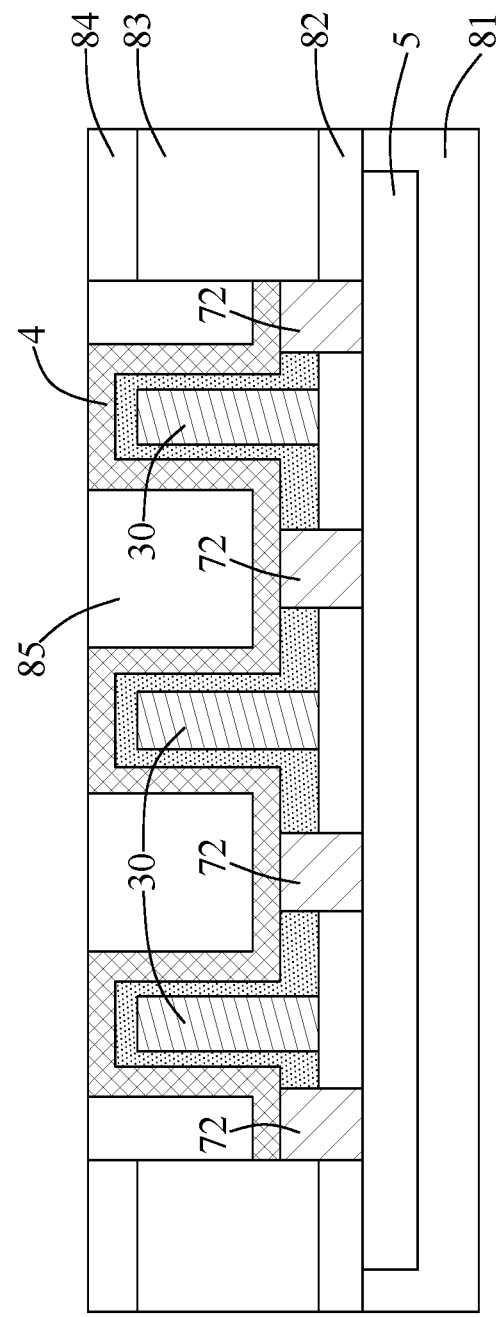

Referring to FIG. 4, the method 400 then proceeds to step 405, where a plurality of gate features are formed. Referring to the example illustrated in FIG. 9, a conductive material is filled in the recesses 31 formed in the third ILD layer 83, and then a planarization (for example, but not limited to, CMP) is conducted to remove excess of the conductive material above the third ILD layer 83, so that a plurality of gate features are formed in the third ILD layer. Since FIG. 9 illustrates a cross-sectional view of the semiconductor 100 to show an intermediate stage of forming the gate features 3 of the memory structure of the semiconductor device 100 shown in FIG. 1, the gate features shown in FIG. 9 are also the gate electrodes 30 of the transistors 11 shown in FIG. 2, and are thus labeled as the gate electrodes 30. Filling of the conductive material in the recesses may be implemented through a blanket deposition process using CVD, PECVD, sub-atmospheric CVD (SACVD), molecular layer deposition (MLD), PVD, ALD, sputtering, other suitable methods, or combinations thereof. The conductive material is similar to those for forming the gate electrodes described above, and details thereof are omitted herein for the sake of brevity.

Referring to FIG. 4, the method 400 then proceeds to step 406, where dielectric layers are formed on the gate features. In some embodiments, the third ILD layer is patterned by an etching process to form dielectric recesses which correspond in position to the bit lines and which expose the gate features and the etch stop layer above the bit lines, and then, through the dielectric recesses, dielectric layers are formed on the etch stop layer to cross over the gate features, and then a fourth ILD layer is formed on the dielectric layers. Referring to the example illustrated in FIG. 10, a dielectric layer 6 is formed on the gate electrodes 30 and the etch stop layer (not shown, which is formed between the second and third ILD layers 82, 83), and partially surround the gate electrodes 30 to cover top surfaces and sidewalls of the gate electrodes 30, and a fourth ILD layer 84 is formed on the dielectric layer 6. The etching process for patterning the third ILD layer to form the dielectric recesses may be implemented by etching the third ILD layer through a patterned photoresist using, for example, but not limited to, a dry etching process, a wet etching process, other suitable processes, or combinations thereof. The dielectric layers may be conformally formed on the gate features exposed from the dielectric recesses by a suitable deposition process, for example, but not limited to, sputtering, CVD, PVD, ALD, PEALD, combinations thereof, or other suitable techniques. In some embodiments, each of the dielectric layers may include one or more layers, each of which is made using one or more of the abovementioned materials for fabricating the gate dielectric 60 shown in FIG. 2. The material and process used for forming the fourth ILD layer is similar to those for forming the first ILD layer, and the details thereof are omitted herein for the sake of brevity.

Referring to FIG. 4, the method 400 then proceeds to step 407, where via holes are formed to expose the bit lines from the via holes. Referring to the example illustrated in FIG. 11, via holes 70 are formed in the fourth ILD layer 84 and through the dielectric layer 6 (see FIG. 10), the etch stop layer and the second ILD layer 82 to expose the bit line 5 from the via holes 70 by using suitable photolithography and etching processes. The dielectric layer 6 is divided by the etching processes into a plurality of gate dielectrics 60 that respectively and partially surround the gate electrodes 30. The photolithography and etching processes for forming the via holes may be implemented in a manner similar to those for forming the recesses in the first ILD layer explained in connection with step 401 above. It is noted that various etching processes utilizing different kinds of etchants for different layers of materials may be adopted to form the via holes in the fourth ILD layer and through the gate dielectric, the etch stop layer and the second ILD layer. Since utilizing different kinds of etchants for different layers of materials has been known to those skilled in the art of semiconductor fabrication, details thereof are omitted herein for the sake of brevity. The via holes are located next to and spaced apart from the gate electrodes.

Referring to FIG. 4, the method 400 then proceeds to step 408, where via contacts are formed in the via holes. Referring to the example illustrated in FIG. 12, a conductive material is deposited to fill bottom portions of the via holes 70 formed adjacent to the gate dielectrics 60 and the second ILD layer 82, and then an etch-back process is conducted to remove excess of the conductive material above the gate dielectrics 60, so that a plurality of via contacts 72 are formed on the bit line 5, in the second ILD layer 82 and beside the gate dielectrics 60. In some embodiments, the via contacts 72 may serve as the second source/drain contacts of the transistors 11 for connection with the bit lines 5 underneath the channel features 4 as shown in FIG. 1. In some embodiments, deposition of the conductive material may be conducted by a suitable fabrication technique known to those skilled in the art of semiconductor fabrication, for example, but not limited to, CVD, PECVD, ALD, PEALD, or other suitable deposition techniques. The conductive material is similar to those for forming the source/drain contacts described above, and details thereof are omitted herein for the sake of brevity. The etch-back process may be implemented by, for example, but not limited to, a dry etching process, a wet etching process, other suitable processes, or combinations thereof. In some embodiments, the etch-back process is performed using an etchant that etches the conductive material, but does not etch the third ILD layer, the fourth ILD layer and the gate dielectric. In some embodiments, top surfaces of the via contacts may curve inward due to the etch-back process.

Referring to FIG. 4, the method 400 then proceeds to step 409, where channel features are formed on the gate dielectrics and the via contacts. Referring to the example illustrated in FIG. 13, portions of the fourth ILD layer 84 that are disposed over the gate dielectrics 60 are removed by using suitable photolithography and etching processes to expose the gate dielectrics 60, and a channel material layer is deposited on the gate dielectrics 60 and the via contacts 72 to form a channel feature 4 on the gate dielectrics 60 and the via contacts 72. The photolithography and etching processes for removing the portions of the fourth ILD layer that are disposed over the gate dielectric may be implemented in a manner similar to those for patterning the third ILD layer to form the dielectric recesses explained in connection with step 406 above, and the details thereof are omitted for the sake of brevity. The material of the channel material layer may be similar to those of the channel layers of the transistors described above. Other suitable semiconductor materials for forming the channel material layer are within the contemplated scope of the present disclosure. Deposition of the channel material layer may be implemented using CVD, PVD, ALD, PECVD, sputtering, spin coating, epitaxial growth, or other suitable techniques.

Referring to FIG. 4, the method 400 then proceeds to step 410, where a fifth ILD layer is formed. Referring to the example illustrated in FIG. 14, an ILD material is deposited on the channel feature 4 and then a planarization process, such as, but not limited to CMP, is performed to remove excess of the ILD material above the channel feature 4 so as to form a fifth ILD layer 85 where top surface segments of the channel feature 4 are flush with a top surface of the fifth ILD layer 85. The material and process used for forming the fifth ILD layer are similar to those for forming the first ILD layer, and the details thereof are omitted herein for the sake of brevity.

Referring to FIG. 4, the method 400 then proceeds to step 411, where connector contacts are formed on the channel features. Referring to the example illustrated in FIG. 15, a sixth ILD layer 86 is formed on the fourth ILD layer 84, the fifth ILD layer 85 and the channel feature 4, and a plurality of connector contacts 71 are formed in the sixth ILD layer 86 and disposed on the top surface of the channel feature 4. In some embodiments, the connector contacts may serve as the first source/drain contacts of the transistors 11 for connection with the capacitors 12 above the transistors 11 as shown in FIG. 1. To form the connector contacts, a plurality of connector holes are formed in the sixth ILD layer and correspond in position to the top surface segments of the channel feature, and a conductive material is then deposited to fill the connector holes, and then a planarization process, such as, but not limited to, CMP, is performed to remove excess of the conductive material above the sixth ILD layer. The material and process used for forming the sixth ILD layer are similar to those for forming the first ILD layer, and the details thereof are omitted herein for the sake of brevity. In some embodiments, formation of the connector holes includes patterning the sixth ILD layer by using suitable photolithography and etching processes. The photolithography and etching processes for forming the connector holes may be implemented in a manner similar to those for forming the via holes in the fourth ILD layer, explained in connection with step 407 above. In some embodiments, deposition of the conductive material may be conducted by a suitable fabrication technique known to those skilled in the art of semiconductor fabrication, for example, but not limited to, CVD, PECVD, ALD, PEALD, or other suitable deposition techniques. The conductive material is similar to those for forming the source/drain contacts described above, and details thereof are omitted herein for the sake of brevity.

Figure 15:
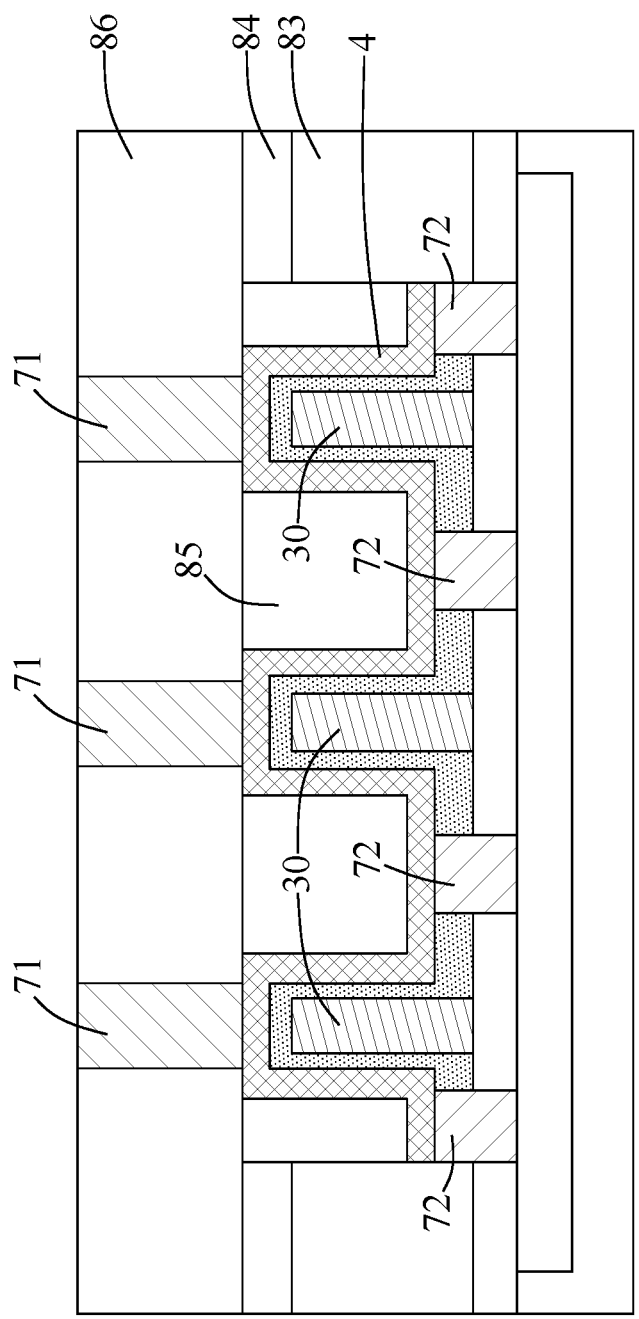
Figure 16:
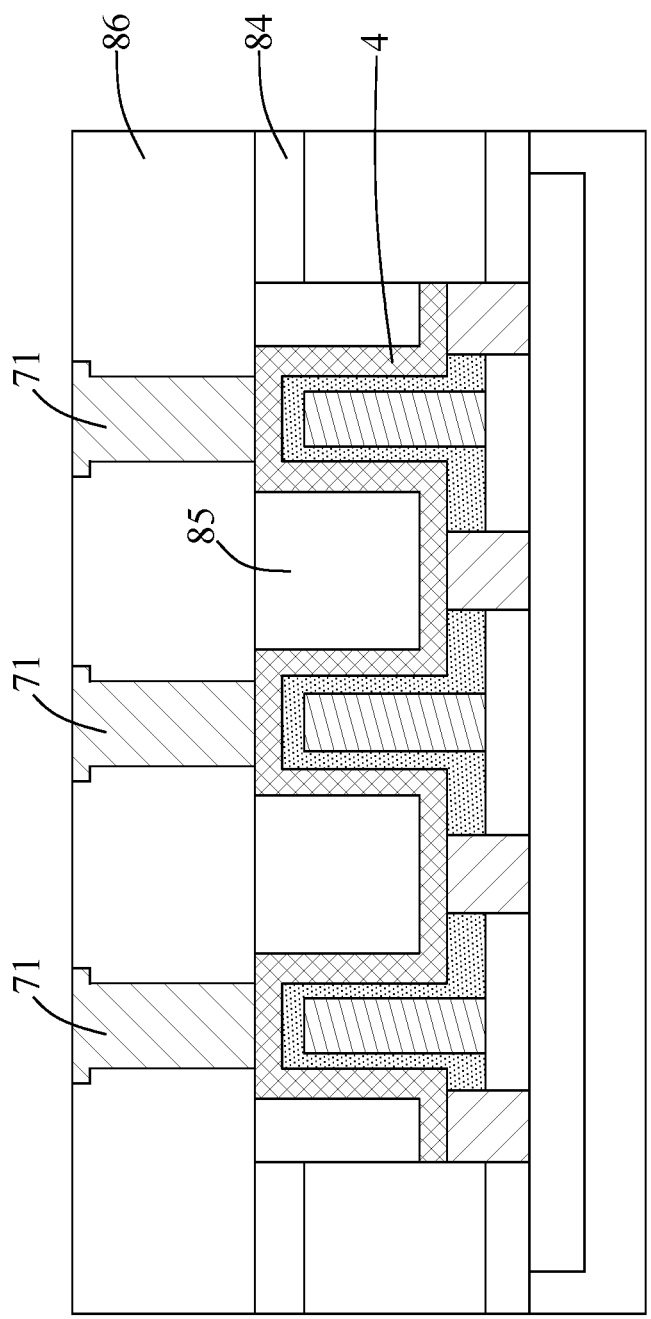

Referring to FIG. 16, which illustrates a variation of the example shown in FIG. 15, top ends of the connector contacts 71 have dimensions (e.g., in the directions of the X- and Y-axes) greater than those of bottom portions of the connector contacts 71. With such design, the connector contacts may have wider connection interfaces with other elements formed in the following stage, such as, but not limited to, electrodes of capacitors to be formed above the transistors, in order to promote tolerance in fabrication of the semiconductor device. Formation of the top ends of the connector contacts may be implemented by repeating the processes for forming the connector contacts explained in step 411, i.e., depositing another ILD layer, forming holes in the another ILD layer at locations of the connector contacts to have dimensions greater than those of the connector contacts, so as to expose the connector contacts from the holes, and depositing conductive material in the holes, followed by a planarization process.

Referring to FIG. 4, the method 400 then proceeds to step 412, where capacitors are formed on the connector contacts. Referring to the example illustrated in FIG. 17, which continues from the example of FIG. 16, a seventh ILD layer 87 is formed on the sixth ILD layer 86 and the connector contacts 71, and a plurality of capacitors 12 are formed in the seventh ILD layer 87 and disposed on and electrically connected to the top ends of the connector contacts 71. To form the capacitors, a plurality of capacitor holes are formed in the seventh ILD layer 87 and correspond in position to the top ends of the connector contacts 71, first conductive material layers 121 are then deposited conformally within the capacitor holes, capacitor dielectric layers 122 are subsequently deposited conformally on the first conductive material layers 121 to cover the first conductive material layers 121, and second conductive material layers 123 are later deposited over the capacitor dielectric layers 122. The first conductive material layers are in electrical connection with the connector contacts (i.e., the first source/drain contacts of the transistors), and serve as bottom electrodes of the capacitors. The second conductive material layers serve as top electrodes of the capacitors. In some embodiments, the first and second conductive material layers may include metallic material, metal nitride, other suitable materials, or combinations thereof. The capacitor dielectric layers may include a high dielectric constant material. The material and process used for forming the seventh ILD layer are similar to those for forming the first ILD layer, and the details thereof are omitted herein for the sake of brevity. In some embodiments, formation of the capacitor holes includes patterning the seventh ILD layer by using suitable photolithography and etching processes. The photolithography and etching processes for forming the capacitor holes may be implemented in a manner similar to those for forming the via holes in the fourth ILD layer, as explained in connection with step 407 above.

Figure 17:
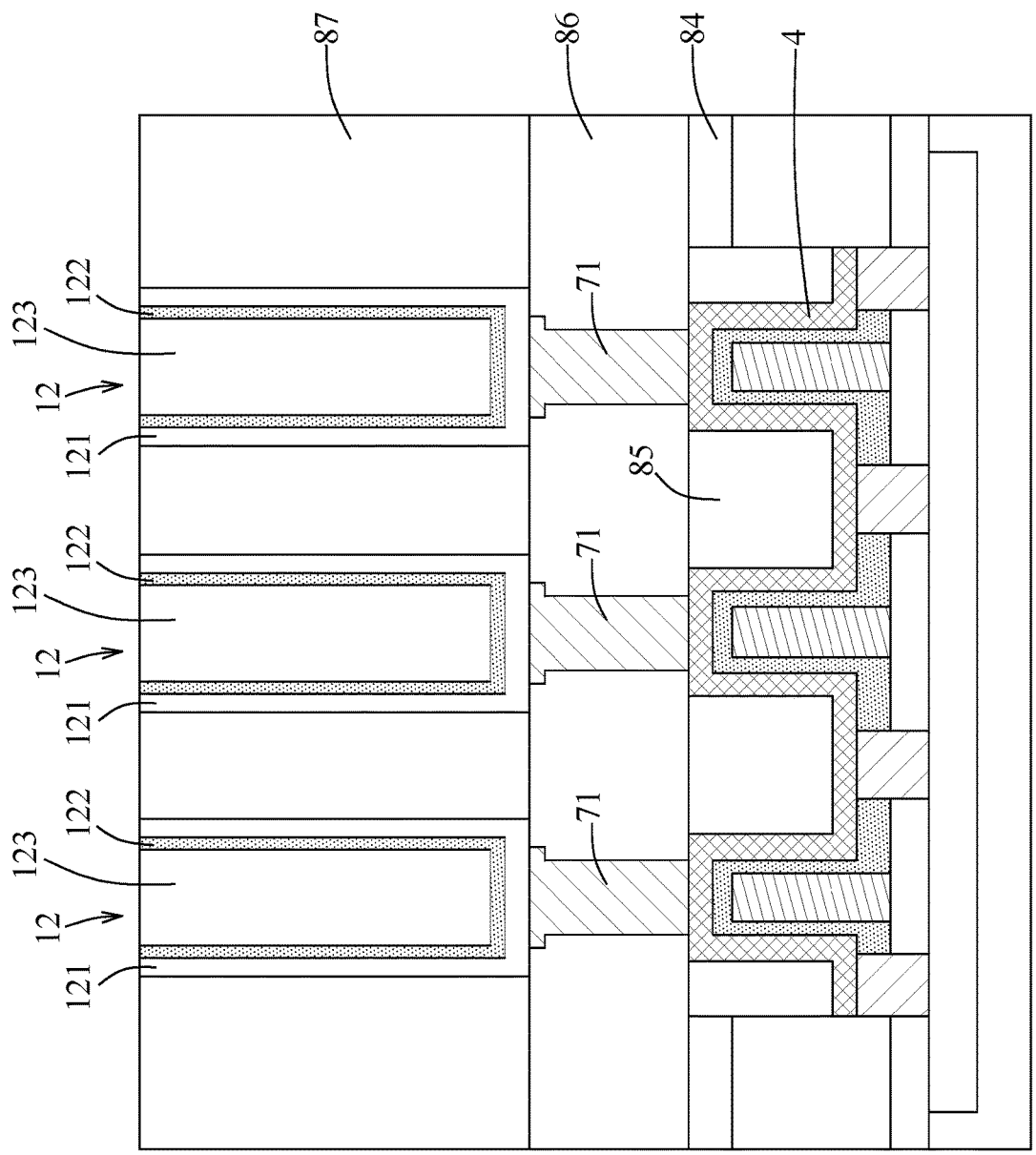
Figure 18:
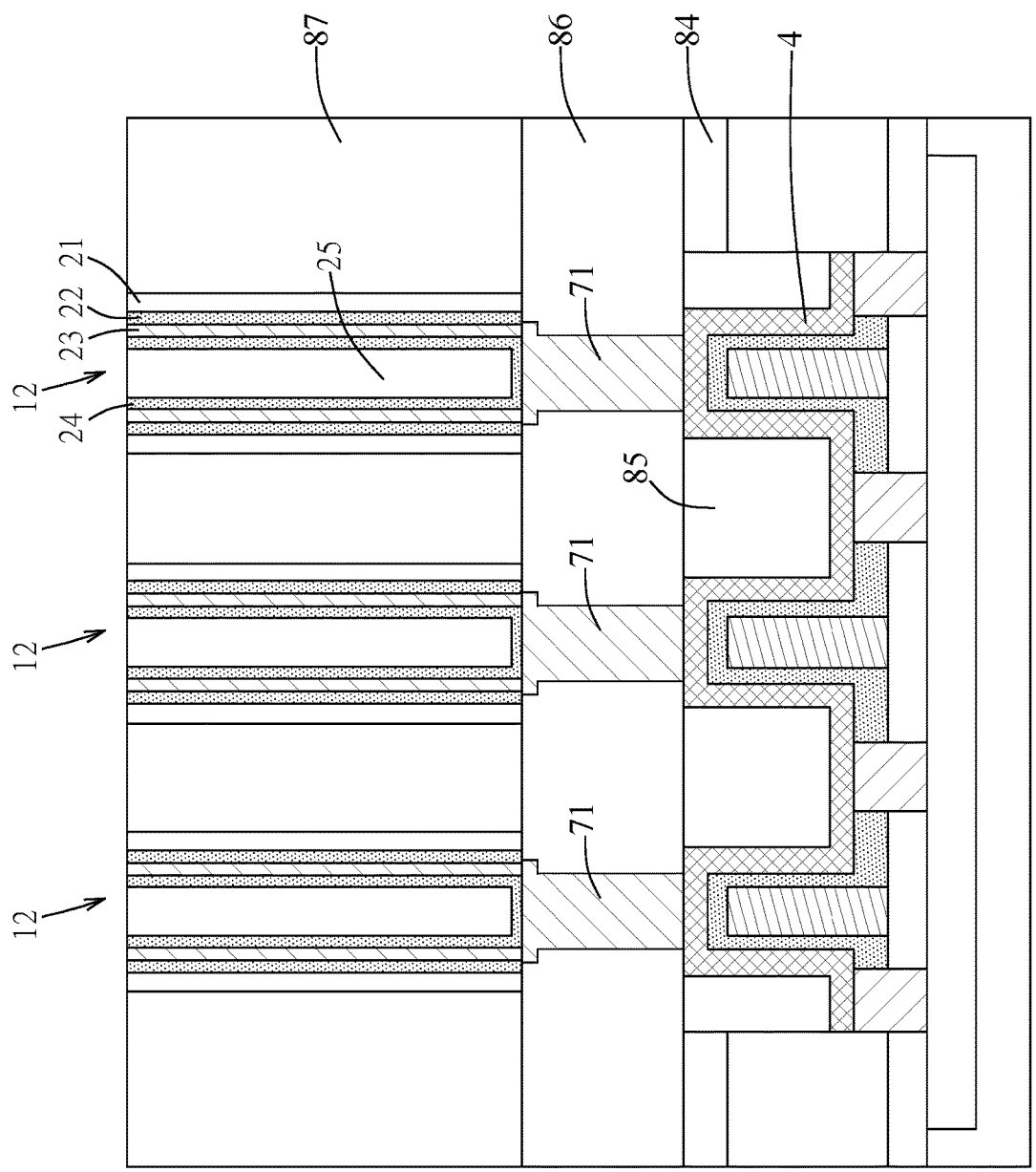

Referring to FIG. 18, which illustrates a variation of the example shown in FIG. 17, each of the capacitors 12 includes, from outside to inside, a cylinder-type conductive plate 21, a first cylinder-type dielectric plate 22, a cylinder-type electrode plate 23, a second cylinder-type dielectric plate 24 with a bottom cover, and a conductive electrode 25. Formation of the capacitors may be implemented by techniques known to those skilled in the art of semiconductor fabrication, and details thereof are omitted herein for the sake of brevity. The cylinder-type electrode plate 23 is in electrical connection with the top end of the corresponding connector contact 71, and is sandwiched between the first and second cylinder-type dielectric plates 22, 24. The first and second cylinder-type dielectric plates 22, 24 serve as insulation to prevent the cylinder-type electrode plate 23 and the top end of the corresponding connector contact 71 from electrically connecting with the cylinder-type conductive plate 21 and the conductive electrode 25. It is noted that the structure of the capacitors is not limited to the disclosure herein and the capacitors may be any type of stacked capacitors known to those skilled in the art of semiconductor fabrication. In some embodiments, the material for forming the cylinder-type electrode plate may be similar to those for forming the source/drain contacts, and the cylinder-type conductive plate and the conductive electrode may include a metallic material, e.g., tungsten or ruthenium, metal nitride (e.g., titanium nitride), other suitable materials, or combinations thereof. The first cylinder-type dielectric plate and the second cylinder-type dielectric plate may include a high dielectric constant material. In this way, the semiconductor device 100 shown in FIGS. 1 to 3 may be fabricated.

Figure 19:
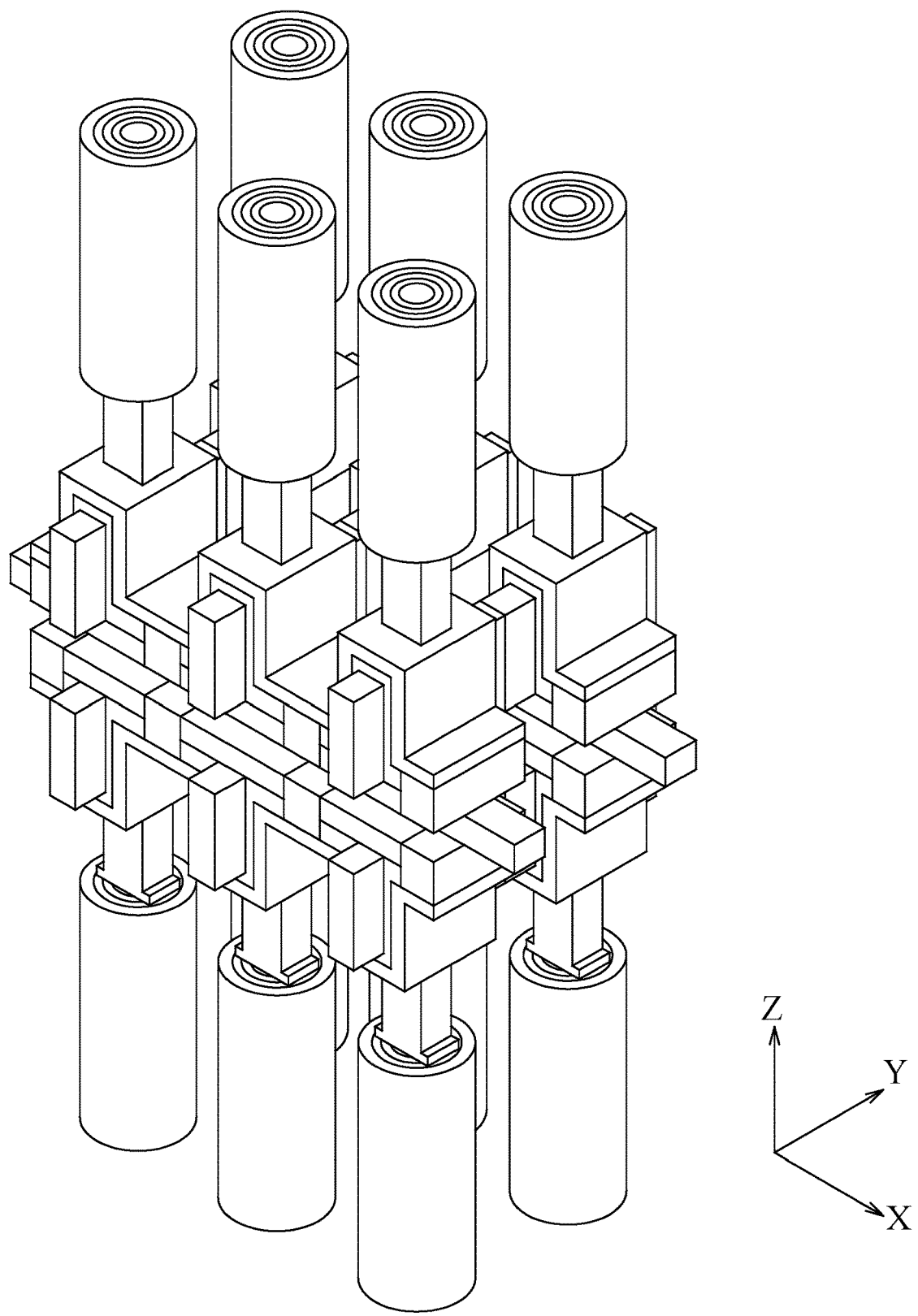
FIG. 19 is a perspective view illustrating a semiconductor device in accordance with some embodiments.

Referring to FIG. 19, which illustrates a variation of the example shown in FIG. 1, where the memory structure may be plural in number and may be stacked. Two memory structures are exemplarily illustrated to be formed in two layers, and memory cells in the two memory structures which correspond in position in the direction of the Z-axis may share a common bit line.

Figure 20:
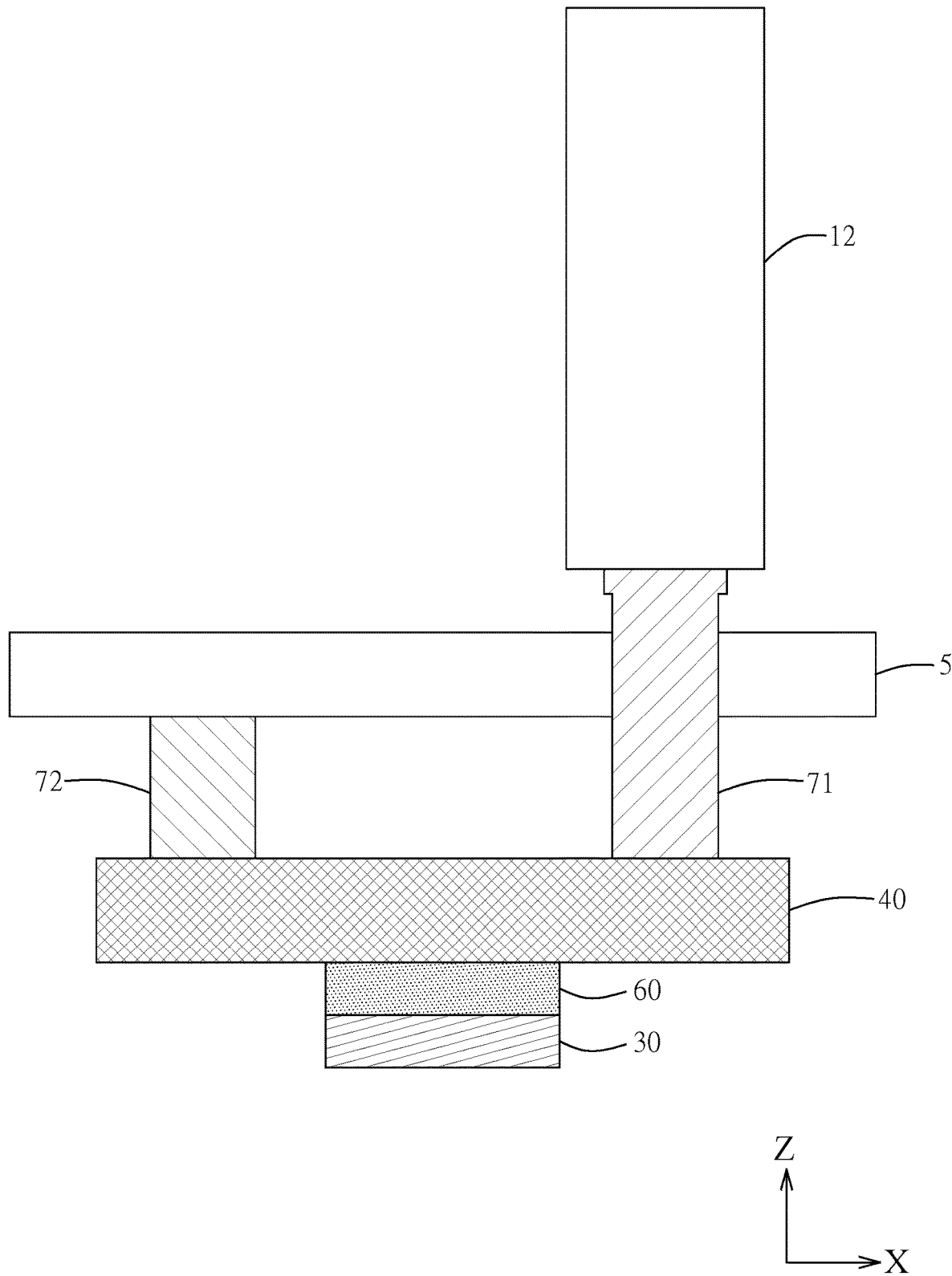
FIG. 20 is a schematic side view illustrating a semiconductor device which includes a planar transistor in accordance with some embodiments.
Figure 21:
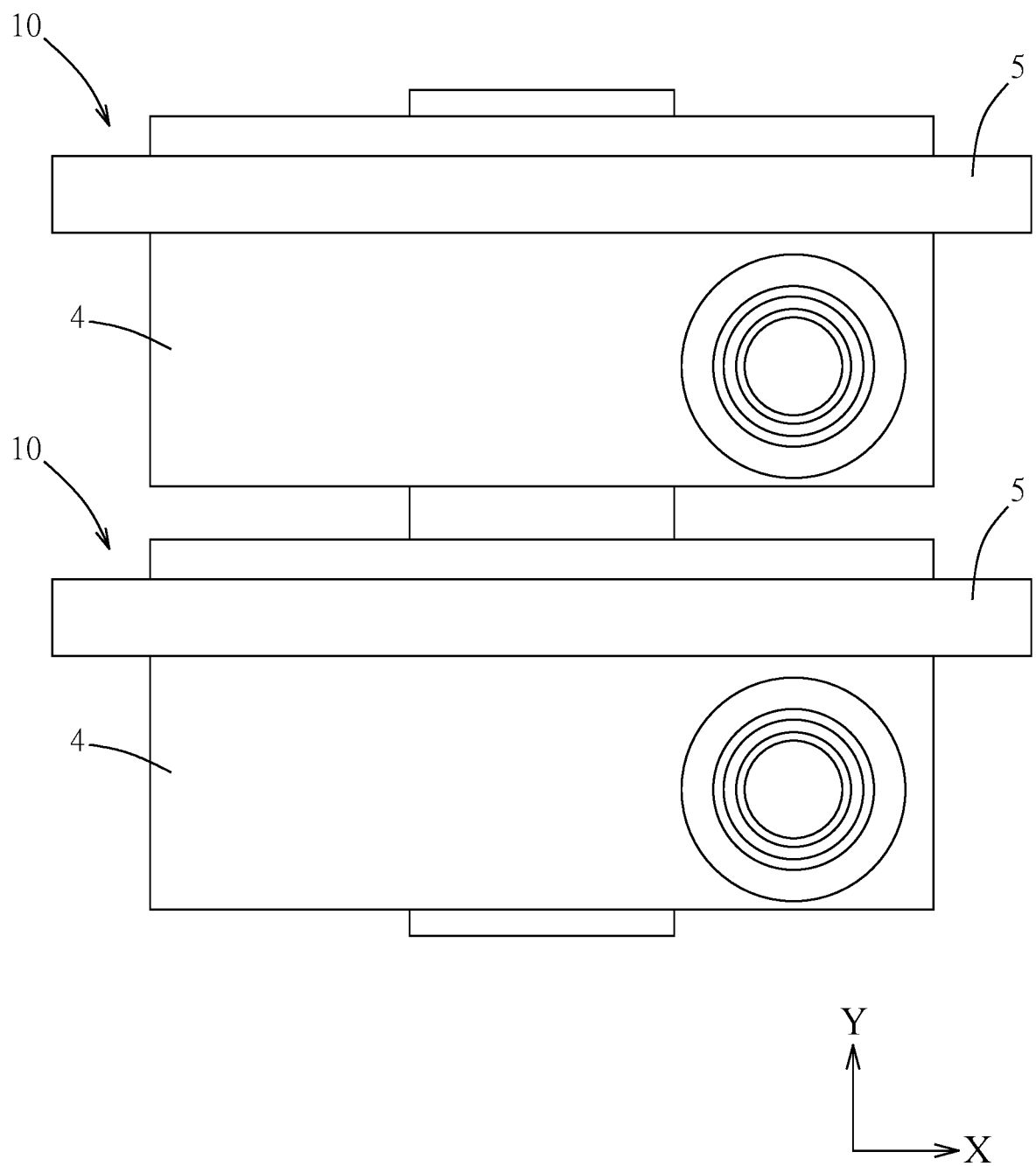
FIG. 21 is a schematic top view illustrating the semiconductor device shown in FIG. 20.

FIG. 20 is a schematic side view illustrating a semiconductor device where a planar transistor is adopted to implement the 1T1C design of a memory structure in accordance with some embodiments. FIG. 21 is a schematic top view illustrating that the semiconductor device includes planar transistors as shown in FIG. 20. It is noted that since channels of the planar transistors are planar, i.e., oriented in a direction parallel to a substrate on which the planar transistors are disposed, the memory cells occupy relatively large areas compared with the memory cells of the semiconductor device shown in FIG. 3, resulting in a larger cell size of the memory structure.

Figure 22:
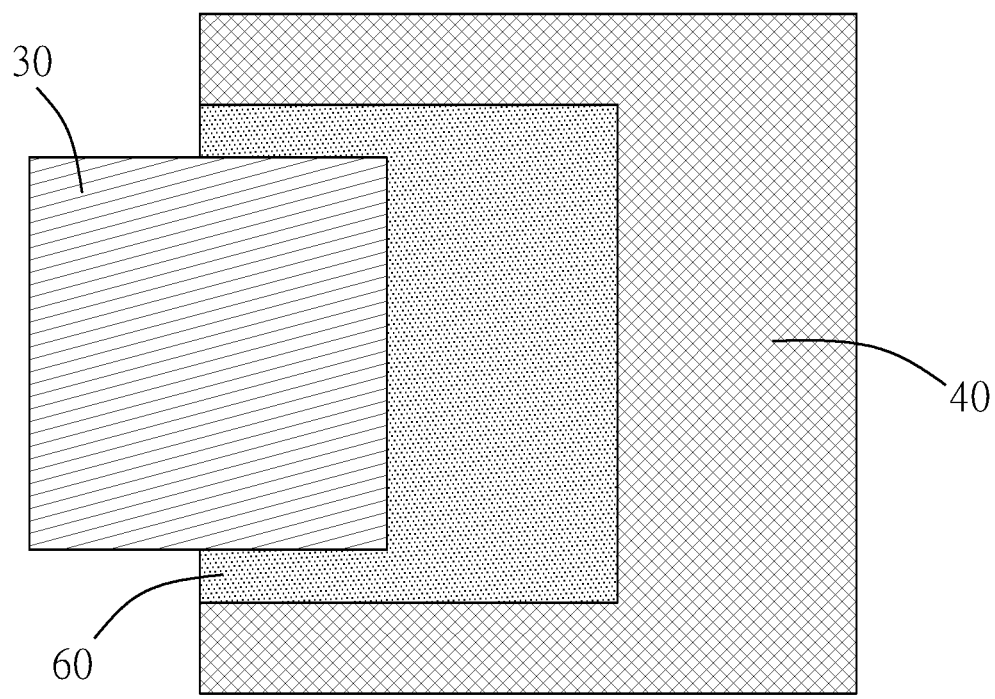
FIG. 22 is a schematic side view illustrating a semiconductor device where a U-shaped channel design is adopted in accordance with some embodiments.
Figure 23:
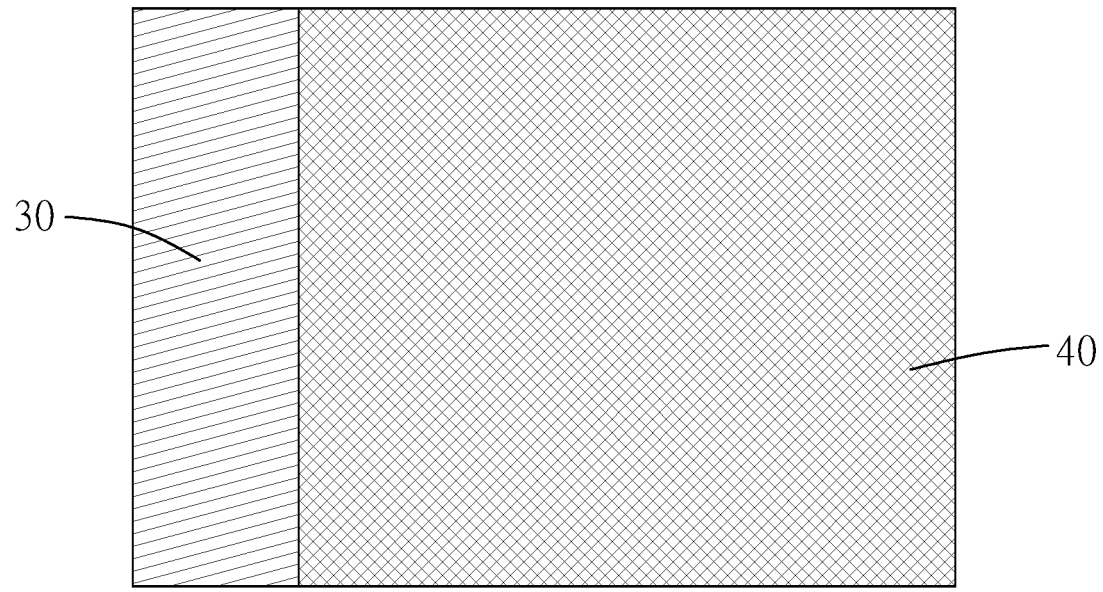
FIG. 23 is a schematic top view of the semiconductor device shown in FIG. 22.
Figure 23:
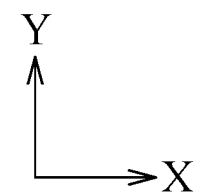

FIG. 22 is a schematic side view illustrating a semiconductor device where a U-shaped channel design is adopted in accordance with some embodiments. FIG. 23 is a schematic top view of the semiconductor device shown in FIG. 22. In such a design, a gate dielectric 60 partially surrounds a gate electrode 30 (specifically, the gate dielectric 60 covers a lateral side of the gate electrode 30 and partially covers top and bottom sides of the gate electrode 30), and a U-shaped channel layer 40 partially surrounds the gate dielectric 60 (specifically, the U-shaped channel layer 40 covers a lateral side of the gate dielectric 60 and partially covers top and bottom sides of the gate dielectric 60) and is spaced apart from the gate electrode 30 by the gate dielectric 60. The connector contact and the via contact which serve as the first and second source/drain contacts (not shown) may be respectively connected to top and bottom portions of the U-shaped channel layer 40 to form a transistor in a 1T1C design for a memory structure, and may be respectively connected to a capacitor and a bit line above and below the transistor.

Figure 24:
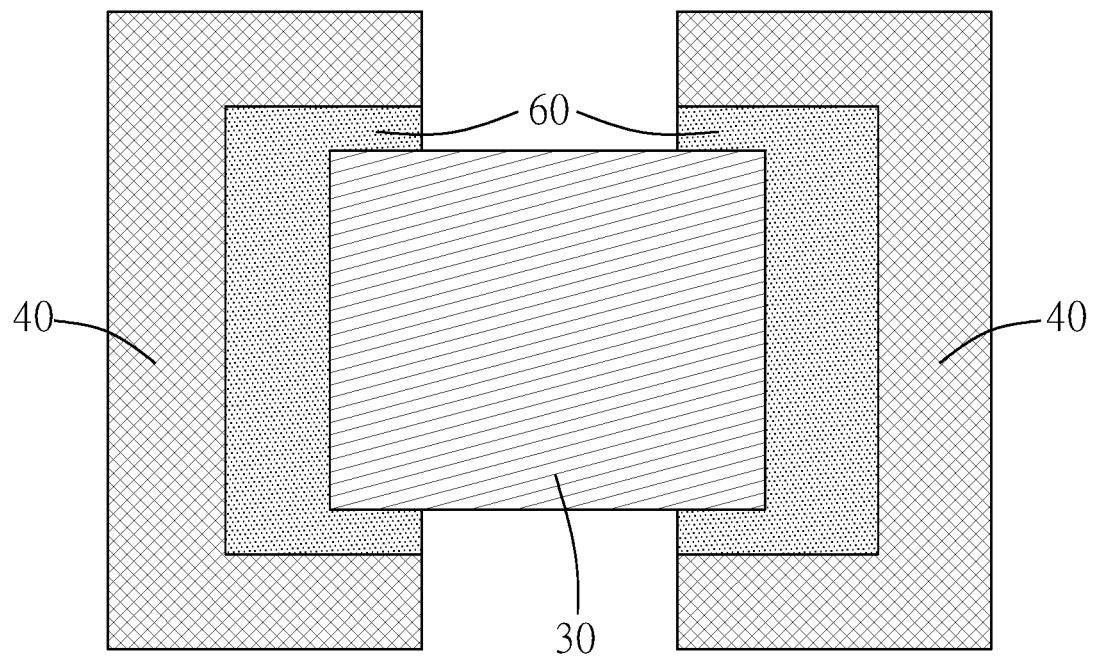
FIG. 24 is a schematic side view illustrating a semiconductor device where a double-sidewall channel design is adopted in accordance with some embodiments.
Figure 24:
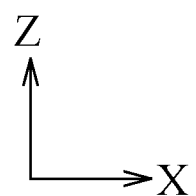
Figure 25:
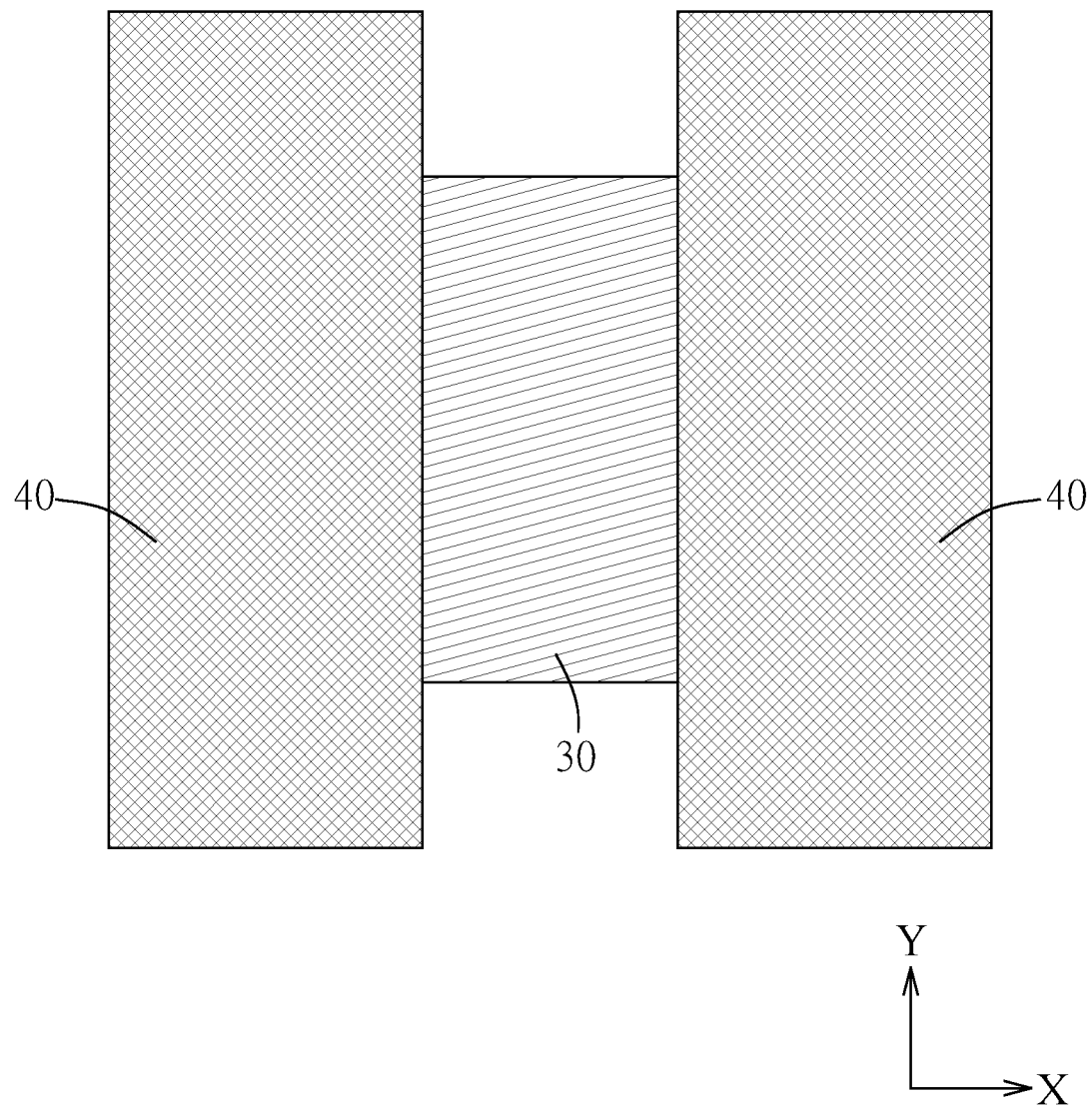
FIG. 25 is a schematic top view of the semiconductor device shown in FIG. 24.

FIG. 24 is a schematic side view illustrating a semiconductor device where a double-sidewall channel design is adopted in accordance with some embodiments. FIG. 25 is a schematic top view of the semiconductor device shown in FIG. 24. In such a design, two gate dielectrics 60 partially surround a gate electrode 30 (specifically, the gate dielectrics 60 respectively cover two lateral sides of the gate electrode 30 and partially cover top and bottom sides of the gate electrode 30), and two U-shaped channel layers respectively and partially surround the gate dielectrics 60 (specifically, each of the U-shaped channel layers covers a lateral side of the respective gate dielectric 60 and partially covers top and bottom sides of the respective gate dielectric 60) and are spaced apart from the gate electrode 30 by the gate dielectrics 60. With respect to each of the U-shaped channel layers 40, the connector contact and the via contact which serve as the first and second source/drain contacts (not shown) may be respectively connected to top and bottom portions of the U-shaped channel layer 40 to form a transistor in a 1T1C design for a memory structure, and may be respectively connected to a capacitor and a bit line above and below the transistor. It is noted that the resultant two transistors exemplarily shown in FIGS. 24 and 25 share a common gate electrode 30.

Figure 26:
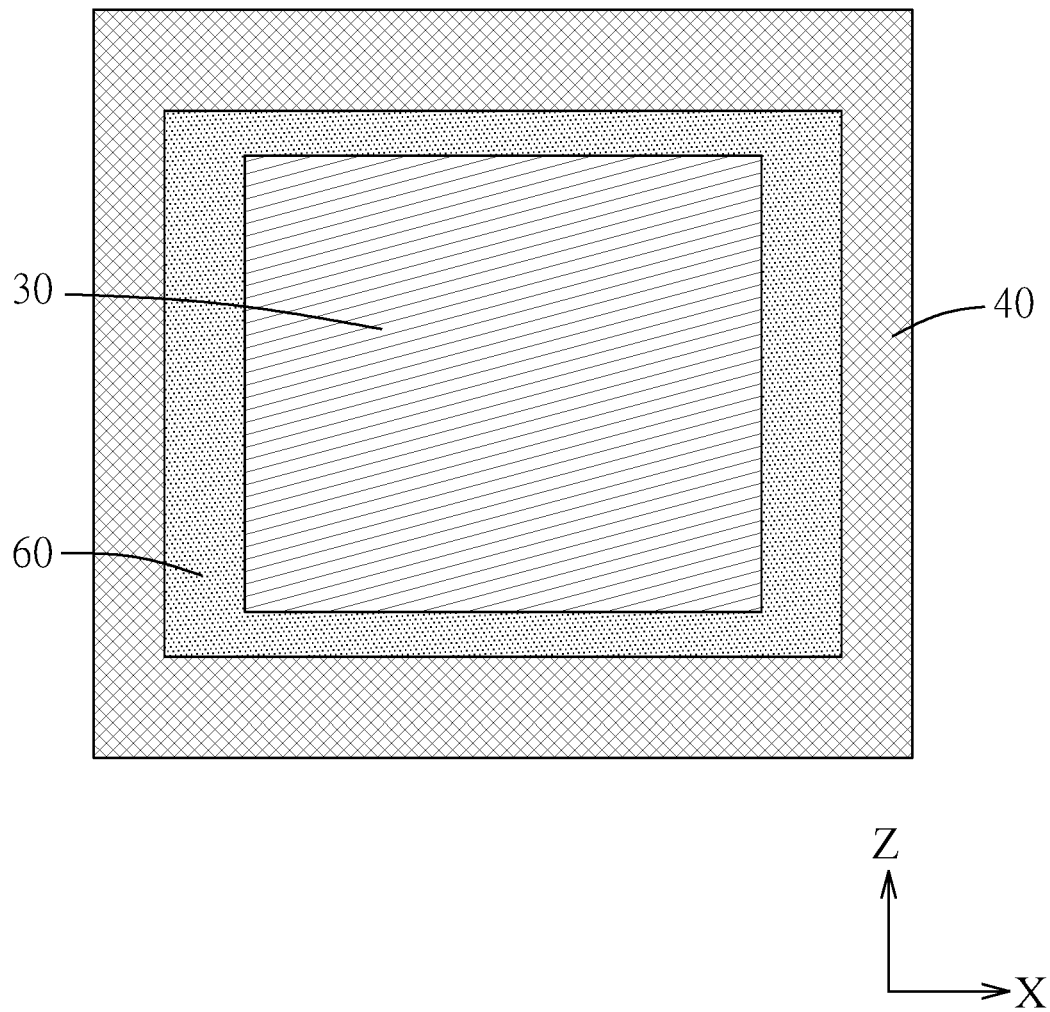
FIG. 26 is a schematic side view illustrating a semiconductor device where a channel-all-around design is adopted in accordance with some embodiments.
Figure 27:
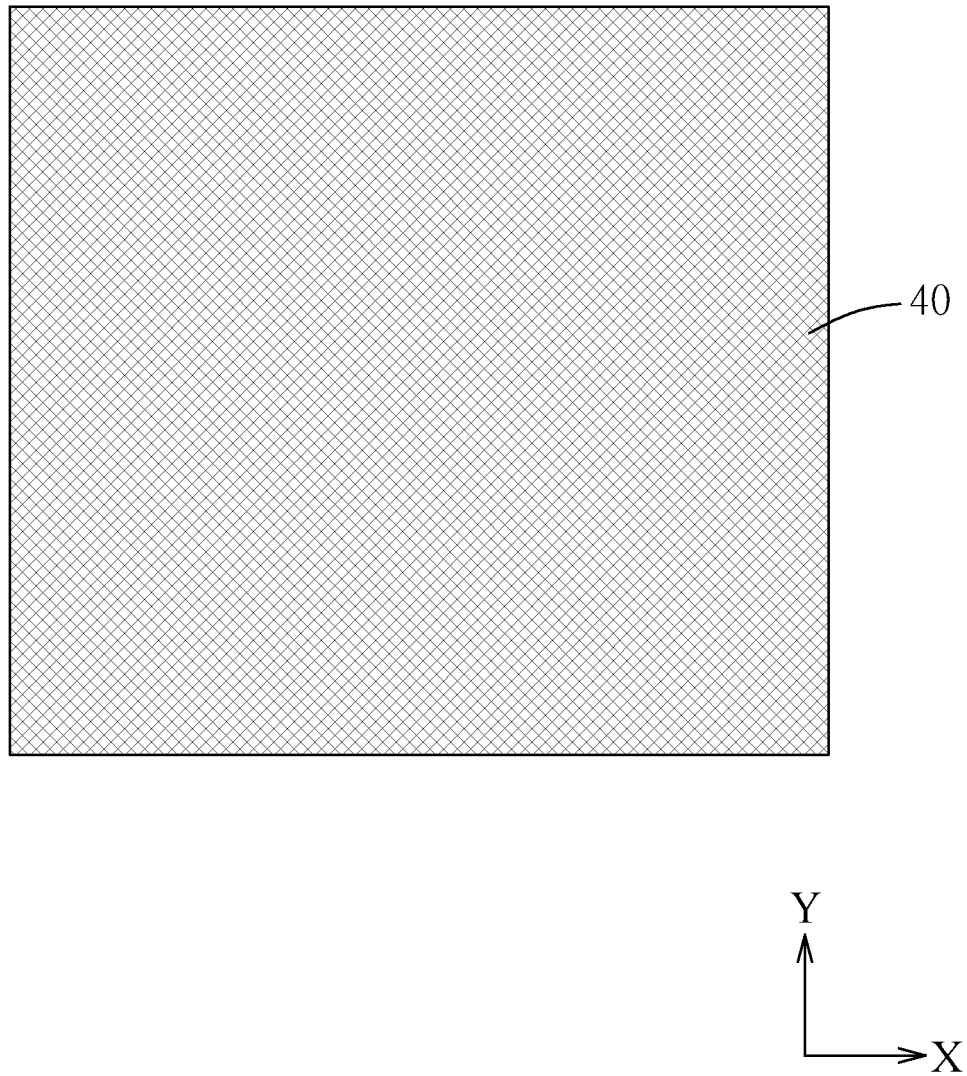
FIG. 27 is a schematic top view of the semiconductor device shown in FIG. 26.

FIG. 26 is a schematic side view illustrating a semiconductor device where a channel-all-around design is adopted in accordance with some embodiments. FIG. 27 is a schematic top view of the semiconductor device shown in FIG. 26. In such a design, a gate dielectric 60 surrounds a gate electrode 30 from top, bottom and two lateral sides of the gate electrode 30, and an all-around channel layer 40 surrounds the gate dielectric 60 from top, bottom and two lateral sides of the gate dielectric 60 and is spaced apart from the gate electrode 30 by the gate dielectric 60. The connector contact and the via contact which serve as the first and second source/drain contacts (not shown) may be respectively connected to top and bottom portions of the all-around channel layer 40 to form a transistor in a 1T1C design for a memory structure, and may be respectively connected to a capacitor and a bit line above and below the transistor. In some embodiments, a memory structure that adopts the channel-all-around design may be a DRAM array, and the gate electrode 30 may extend in the direction of the Y-axis and may directly serve as a word line.

Figure 28:
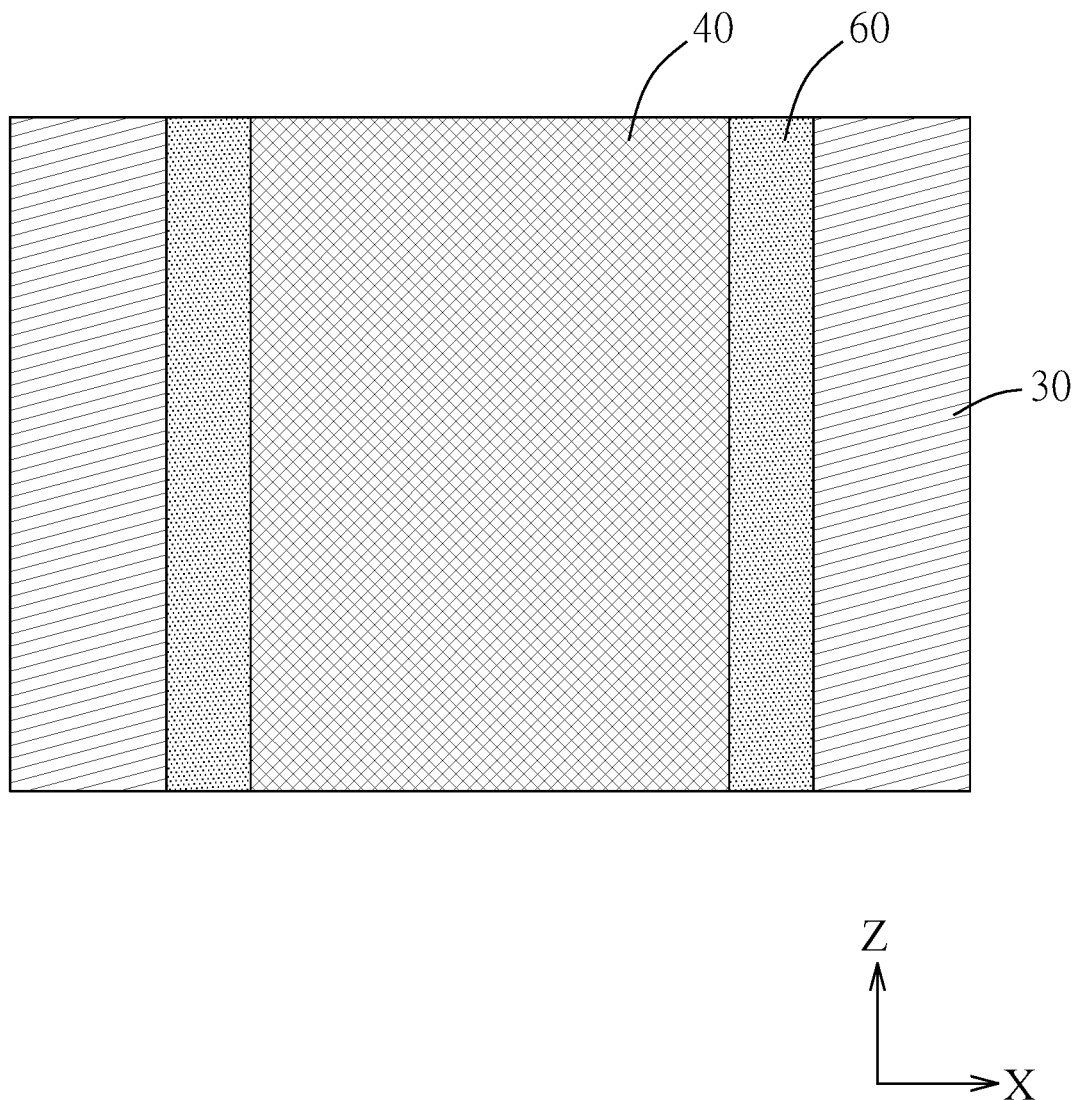
FIG. 28 is a schematic cross-sectional view illustrating a semiconductor device where a gate-all-around design is adopted in accordance with some embodiments.
Figure 29:
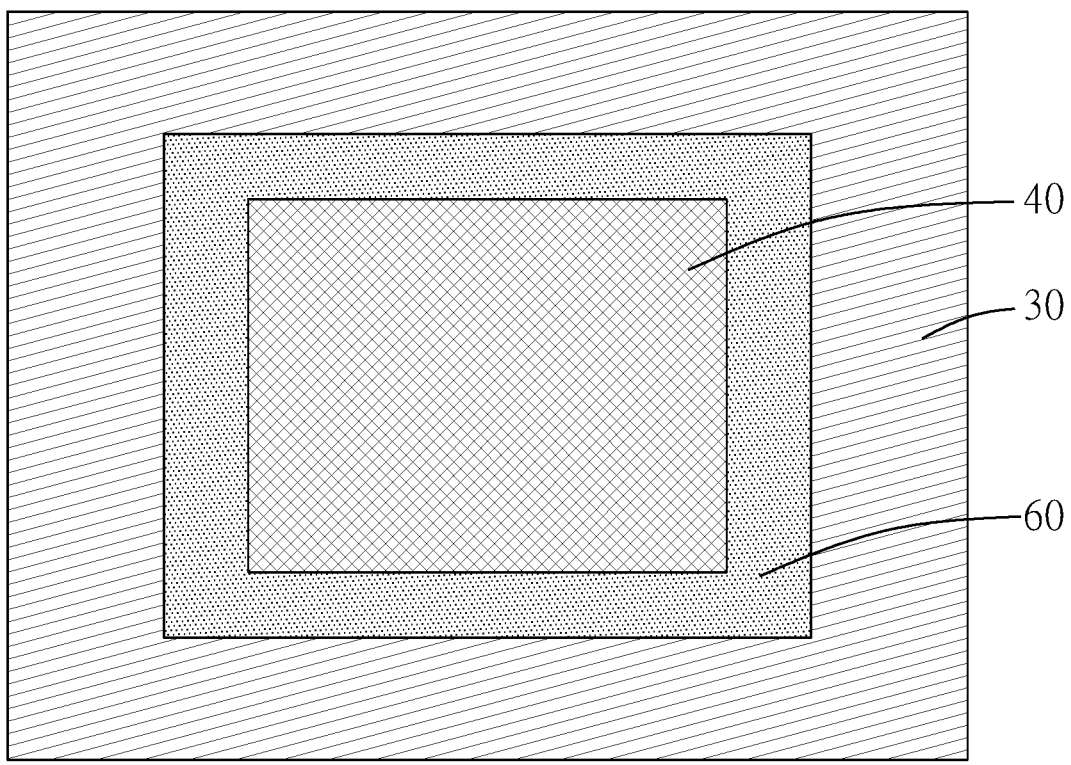
FIG. 29 is a schematic top view of the semiconductor device shown in FIG. 28.

FIG. 28 is a schematic cross-sectional view illustrating a semiconductor device where a gate-all-around design is adopted in accordance with some embodiments. FIG. 29 is a schematic top view of the semiconductor device shown in FIG. 28. In such a design, a gate dielectric 60 surrounds a channel layer 40 from four lateral sides of the channel layer 40, and an all-around gate electrode 30 surrounds the gate dielectric 60 from four lateral sides of the gate dielectric 60 and is spaced apart from the channel layer 40 by the gate dielectric 60. Since top and bottom portions of the channel layer 40 are not surrounded, the connector contact and the via contact which serve as the first and second source/drain contacts (not shown) may be respectively connected to the top and bottom portions of the channel layer 40 to form a transistor in a 1T1C design for a memory structure, and may be respectively connected to a capacitor and a bit line above and below the transistor. It is noted that the gate-all-around design can promote the channel control ability of a transistor, so that the on-state current of the transistor may be increased while the off-state current may be decreased.

In the semiconductor device of the present disclosure, since the vertical channel of each of the transistors is formed in a direction substantially orthogonal to a direction of the plane of fabrication, the transistor may occupy smaller area on the plane of fabrication, thereby reducing the cell size of memory cells and increasing the cell density in the memory structure. Moreover, by making the channel vertical, more space may be allotted for a longer channel, promoting performance of the on-sate/off-state currents of the transistor. Further, by utilizing TFTs to serve as the transistors in the 1T1C design for the memory structure, fabrication of the memory structure may be integrated in the BEOL of the fabrication process, which may be implemented at a relatively lower temperature and save chip area in the FEOL. Last but not least, with the proposed structure of the semiconductor device in the present disclosure, a bit line may be positioned at bottom sides of the transistors and directly connected to the second source/drain contacts (i.e., via contacts) of the transistors, thereby saving space for metal routing.

In accordance with some embodiments of the present disclosure, a semiconductor device includes a transistor that is disposed on a substrate. The transistor includes a gate electrode located over the substrate, a gate dielectric disposed on the gate electrode, a channel layer disposed on the gate dielectric, a first source/drain contact disposed on the channel layer and located on a side of the channel layer that is opposite to the substrate, and a second source/drain contact disposed on the channel layer and located on a side of the channel layer that faces the substrate. One of the gate electrode and the gate dielectric at least partially surrounds the other one of the gate electrode and the gate dielectric. One of the gate dielectric and the channel layer at least partially surrounds the other one of the gate dielectric and the channel layer. A region of the channel layer between the first source/drain contact and the second source/drain contact is elongated in a direction perpendicular to the substrate.

In accordance with some embodiments of the present disclosure, the gate dielectric is formed on a top surface and sidewalls of the gate electrode to partially surround the gate electrode.

In accordance with some embodiments of the present disclosure, the channel layer is formed on a top surface and sidewalls of the gate dielectric to partially surround the gate dielectric.

In accordance with some embodiments of the present disclosure, the channel layer is formed on a top surface and sidewalls of the gate dielectric to partially surround the gate dielectric.

In accordance with some embodiments of the present disclosure, the top surface of the channel layer has a dimension smaller than a dimension of a sidewall of the region of the channel layer between the first source/drain contact and the seconds source/drain contact.

In accordance with some embodiments of the present disclosure, the first source/drain contact includes a bottom portion disposed on the top surface of the channel layer, and a top end connected to the bottom portion and distal from the channel layer. The top end has dimensions greater than those of the bottom portion.

In accordance with some embodiments of the present disclosure, the semiconductor device further includes a capacitor that is located over the transistor and that includes a capacitor electrode electrically connected to the first source/drain contact of the transistor. The capacitor and the transistor cooperate to form a one-transistor, one-capacitor (1T1C) memory cell.

In accordance with some embodiments of the present disclosure, the second source/drain contact is located next to the gate electrode, is spaced apart from the gate electrode by the gate dielectric, and is in contact with a bottom portion of the channel layer that is adjacent to a foot of a sidewall of the gate electrode.

In accordance with some embodiments of the present disclosure, the semiconductor device further includes a bit line that is disposed on the substrate. The transistor is located over the bit line, and the second source/drain contact extends from the channel layer to the bit line and is electrically connected to the bit line.

In accordance with some embodiments of the present disclosure, the gate dielectric covers a lateral side and portions of top and bottom sides of the gate electrode, and the channel layer is a U-shaped channel layer which covers a lateral side and top and bottom sides of the gate dielectric and is spaced apart from the gate electrode by the gate dielectric.

In accordance with some embodiments of the present disclosure, a number of the gate dielectric is two and a number of the channel layer is two. The two gate dielectrics cover two lateral sides and portions of top and bottom sides of the gate electrode. The two channel layer are two U-shaped channel layers each of which covers a lateral side and top and bottom sides of a respective one of the gate dielectrics and is spaced apart from the gate electrode by the respective one of the gate dielectrics.

In accordance with some embodiments of the present disclosure, the gate dielectric covers top, bottom and two lateral sides of the gate electrode, and the channel layer is an all-around channel layer which covers top, bottom and two lateral sides of the gate dielectric and is spaced apart from the gate electrode by the gate dielectric.

In accordance with some embodiments of the present disclosure, the gate dielectric covers four lateral sides of the channel layer, and the gate electrode is an all-around gate electrode which covers four lateral sides of the gate dielectric and is spaced apart from the channel layer by the gate dielectric.

In accordance with some embodiments of the present disclosure, a semiconductor device includes at least one bit line extending in a first direction, at least one gate feature extending in a second direction that is substantially perpendicular to the first direction, and located over the bit line, at least one channel feature extending in the first direction and located over the gate feature, and at least one capacitor located over the at least one channel feature, and electrically connected to the at least one channel feature at a location where the at least one channel feature crosses over the at least one gate feature. The channel feature is formed on a top surface and sidewalls of a segment of the at least one gate feature to cross over the at least one gate feature.

In accordance with some embodiments of the present disclosure, the semiconductor device further includes at least one connector contact disposed on the at least one channel feature at the location where the at least one channel feature crosses over the at least one gate feature, and interconnecting the at least one channel feature and a capacitor electrode of the at least one capacitor.

In accordance with some embodiments of the present disclosure, the semiconductor device further includes at least one via contact disposed on the at least one channel feature at a location beside the at least one gate electrode and distal from the at least one capacitor, and electrically connected to the at least one bit line located beneath the at least one channel feature.

In accordance with some embodiments of the present disclosure, the semiconductor device further includes at least one gate dielectric extending in the first direction, located over the at least one bit line and crossing over the at least one gate feature. The at least one channel feature is formed on the gate dielectric layer and is spaced apart from the at least one gate feature by the at least one gate dielectric.

In accordance with some embodiments of the present disclosure, a method for manufacturing a semiconductor device includes:

forming a conductive line in a substrate; forming an interlayer dielectric (ILD) layer on the substrate formed with the conductive line;

forming a gate feature on the dielectric layer, the gate feature extending substantially perpendicular to the conductive line;

forming a gate dielectric layer on the gate feature and the ILD layer, the gate dielectric layer corresponding in position to the conductive line and crossing over the gate feature;

forming a via contact next to the gate feature in the gate dielectric layer and through the ILD layer for connection with the conductive line; and forming a channel feature on the gate dielectric layer and the via contact, the channel feature corresponding in position to the conductive line, partially surrounding the gate feature and being spaced apart from the gate feature by the gate dielectric layer.

In accordance with some embodiments of the present disclosure, the method further includes forming a connector contact on the channel feature. The connector contact located over the gate feature and extending in a direction opposite to the substrate.

In accordance with some embodiments of the present disclosure, the method further includes forming a capacitor on the connector contact. The capacitor extending in a direction that is opposite to the substrate and including a capacitor electrode that is electrically connected to the connector contact.

The foregoing outlines features of several embodiments so that those skilled in the art may better understand the aspects of the present disclosure. Those skilled in the art should appreciate that they may readily use the present disclosure as a basis for designing or modifying other processes or structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising a transistor that is disposed on a substrate and that includes:
   a bit line located over the substrate and extending in a first direction;
   a gate electrode disposed above the bit line and extending in a second direction parallel to the substrate and perpendicular to the first direction;
   a gate dielectric disposed on the gate electrode, and one of the gate electrode and the gate dielectric at least partially surrounding the other one of the gate electrode and the gate dielectric;
   a channel layer disposed on the gate dielectric, and disposed above the bit line, one of the gate dielectric and the channel layer at least partially surrounding the other one of the gate dielectric and the channel layer;
   a first source/drain contact disposed on the channel layer and located on a side of the channel layer that is opposite to the substrate; and
   a second source/drain contact disposed on the channel layer and located on a bottom surface of the channel layer that faces the substrate;
   wherein a region of the channel layer between the first source/drain contact and the second source/drain contact extends in a direction perpendicular to the substrate.

2. The semiconductor device of claim 1, wherein the gate dielectric is formed on a top surface and sidewalls of the gate electrode to partially surround the gate electrode.

3. The semiconductor device of claim 2, wherein the channel layer is formed on a top surface and sidewalls of the gate dielectric to partially surround the gate dielectric.

4. The semiconductor device of claim 3, wherein the first source/drain contact is disposed on a top surface of the channel layer and is formed over the top surface of the gate electrode.

5. The semiconductor device of claim 4, wherein the top surface of the channel layer has a dimension smaller than a dimension of a sidewall of the region of the channel layer between the first source/drain contact and the seconds source/drain contact.

6. The semiconductor device of claim 4, wherein the first source/drain contact includes a bottom portion disposed on the top surface of the channel layer, and a top end connected to the bottom portion and distal from the channel layer, the top end having dimensions greater than those of the bottom portion.

7. The semiconductor device of claim 1, further comprising a capacitor that is located over the transistor and that includes a capacitor electrode electrically connected to the first source/drain contact of the transistor, the capacitor and the transistor cooperating to form a one-transistor, one-capacitor (1T1C) memory cell.

8. The semiconductor device of claim 1, wherein the second source/drain contact is located next to the gate electrode, is spaced apart from the gate electrode by the gate dielectric, and is in contact with a bottom portion of the channel layer that is adjacent to a foot of a sidewall of the gate electrode.

9. The semiconductor device of claim 1, wherein the transistor is located over the bit line, and the second source/drain contact extends from the channel layer to the bit line and is electrically connected to the bit line.

10. The semiconductor device of claim 1, wherein the gate dielectric covers a lateral side and portions of top and bottom sides of the gate electrode, and the channel layer is a U-shaped channel layer which covers a lateral side and top and bottom sides of the gate dielectric and is spaced apart from the gate electrode by the gate dielectric.

11. The semiconductor device of claim 1, wherein a number of the gate dielectric is two and a number of the channel layer is two, the two gate dielectrics covering two lateral sides and portions of top and bottom sides of the gate electrode, the two channel layer being two U-shaped channel layers each of which covers a lateral side and top and bottom sides of a respective one of the gate dielectrics and is spaced apart from the gate electrode by the respective one of the gate dielectrics.

12. The semiconductor device of claim 1, wherein the gate dielectric covers top, bottom and two lateral sides of the gate electrode, and the channel layer is an all-around channel layer which covers top, bottom and two lateral sides of the gate dielectric and is spaced apart from the gate electrode by the gate dielectric.

13. The semiconductor device of claim 1, wherein the gate dielectric covers four lateral sides of the channel layer, and the gate electrode is an all-around gate electrode which covers four lateral sides of the gate dielectric and is spaced apart from the channel layer by the gate dielectric.

14. A semiconductor device comprising:
   a substrate;
   at least one bit line disposed on the substrate and extending in a first direction;
   at least one gate feature extending in a second direction that is parallel to the substrate and substantially perpendicular to the first direction, and located over the bit line, a bottom surface of the at least one gate feature being disposed above a top surface of the at least one bit line;

at least one channel feature extending in the first direction and located over the gate feature, the at least one channel feature formed on a top surface and sidewalls of a segment of the at least one gate feature to cross over the at least one gate feature, the at least one channel feature disposed above the at least one bit line; and at least one capacitor located over the at least one channel feature, and electrically connected to the at least one channel feature at a location where the at least one channel feature crosses over the at least one gate feature.

15. The semiconductor device of claim 14, further comprising:

at least one connector contact disposed on the at least one channel feature at the location where the at least one channel feature crosses over the at least one gate feature, and interconnecting the at least one channel feature and a capacitor electrode of the at least one capacitor.

16. The semiconductor device of claim 14, further comprising:

at least one via contact disposed on the at least one channel feature at a location beside the at least one gate electrode and distal from the at least one capacitor, and electrically connected to the at least one bit line located beneath the at least one channel feature.

17. The semiconductor device of claim 14, further comprising:

at least one gate dielectric extending in the first direction, located over the at least one bit line and crossing over the at least one gate feature;

wherein the at least one channel feature is formed on the gate dielectric layer and is spaced apart from the at least one gate feature by the at least one gate dielectric.

18. A method for manufacturing a semiconductor device, comprising:

forming a conductive line in a substrate;

forming an interlayer dielectric (ILD) layer on the substrate formed with the conductive line;

forming a gate feature on the ILD layer, the gate feature extending parallel to the substrate and being substantially perpendicular to the conductive line;

forming a gate dielectric layer on the gate feature and the ILD layer, the gate dielectric layer disposed above the conductive line and crossing over the gate feature;

forming a via contact next to the gate feature in the gate dielectric layer and through the ILD layer for connection with the conductive line; and forming a channel feature on the gate dielectric layer and the via contact, the channel feature disposed above the conductive line, partially surrounding the gate feature and being spaced apart from the gate feature by the gate dielectric layer.

19. The method of claim 18, further comprising:

forming a connector contact on the channel feature, the connector contact located over the gate feature and extending in a direction opposite to the substrate.

20. The method of claim 19, further comprising:

forming a capacitor on the connector contact, the capacitor extending in a direction that is opposite to the substrate and including a capacitor electrode that is electrically connected to the connector contact.

* * * * *